United States Patent [19]
Aoai et al.

[11] Patent Number: 6,037,098
[45] Date of Patent: Mar. 14, 2000

[54] POSITIVE PHOTOSENSITIVE COMPOSITION

[75] Inventors: Toshiaki Aoai; Satoshi Takita, both of Shizuoka, Japan

[73] Assignee: Fuji Photo Film Co., Ltd., Kanagawa, Japan

[21] Appl. No.: 09/050,007

[22] Filed: Mar. 30, 1998

[30] Foreign Application Priority Data

Mar. 31, 1997 [JP] Japan ..................................... 9-080666
Mar. 31, 1997 [JP] Japan ..................................... 9-081075

[51] Int. Cl.$^7$ ....................................................... C08F 2/50
[52] U.S. Cl. ....................... 430/270.1; 430/914; 430/921; 430/922
[58] Field of Search ................................ 430/270.1, 914, 430/921, 922

[56] References Cited

U.S. PATENT DOCUMENTS 5,693,452  12/1997  Aoai et al. ........................... 430/270.1
5,731,364  3/1998   Sinta et al. ............................... 522/31

FOREIGN PATENT DOCUMENTS 6-199770  7/1994  Japan .

OTHER PUBLICATIONS

Derwent and EP patent office esp@cenet English Abstracts of JP 6–199770.
"Complex triarylsulfonium salts as photoacid generators for deep UV microlithography", Cameron, J.F., et al. SPIE 3049, 1997, 473–483.

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

Provided is a positive photosensitive composition which has high photosensitivity, is capable of giving an excellent resist pattern, and changes little with time after exposure. The positive photosensitive composition comprises a resin having group(s) capable of decomposing by the action of an acid to enhance solubility of the resin in an alkaline developing solution and a compound represented by formula (Ia) or (Ib) which is capable of generating a sulfonic acid upon irradiation with actinic rays or a radiation:

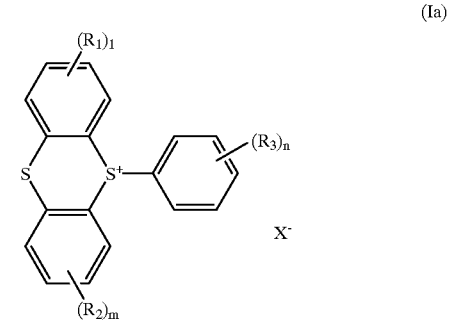

(Ia)

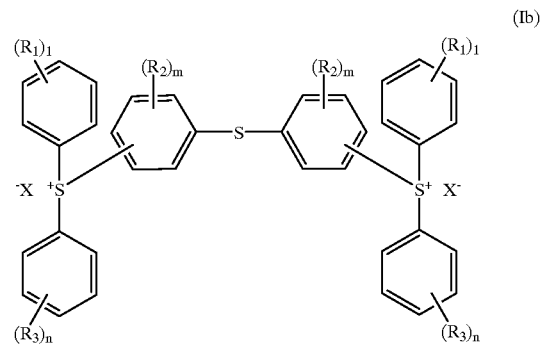

(Ib)

wherein $R_1$ to $R_3$ each represents a hydrogen atom, an alkyl group, a cycloalkyl group, an alkoxy group, a hydroxy group, a halogen atom, or a group represented by —S—$R_4$, where $R_4$ represents an alkyl group or an aryl group; X$^-$ represents the specific anion of a benzenesulfonic, naphthalenesulfonic, or anthracenesulfonic acid; and l, m, and n represents an integer of 1 to 3.

9 Claims, No Drawings

POSITIVE PHOTOSENSITIVE COMPOSITION

FIELD OF THE INVENTION

The present invention relates to a positive photosensitive composition for use in the production of lithographic printing plates and semiconductors, e.g., ICs, and the production of circuit boards for liquid crystals, thermal heads, etc., and in other photofabrication processes.

BACKGROUND OF THE INVENTION

Positive photoresist compositions in use generally comprise an alkali-soluble resin and a naphthoquinonediazide compound as a photosensitive substance. For example, photoresist compositions comprising "a combination of a phenolic novolak resin and a naphthoquinonediazide substitution compound" are described in, e.g., U.S. Pat. Nos. 3,666,473, 4,115,128, and 4,173,470. Further, an example of the most typical composition comprising "a combination of a cresol-formaldehyde novolak resin and a trihydroxybenzophenone-1,2-naphthoquinonediazidesulfonic acid ester" is described in L. F. Thompson, "Introduction to Microlithography" (ACS Press, No. 2, 19, pp. 112–121).

In such a positive photoresist consisting basically of a novolak resin and a quinonediazide compound, the novolak resin imparts high plasma etching resistance and the naphthoquinonediazide compound functions as a dissolution inhibiting agent. The naphthoquinonediazide has the property of generating a carboxylic acid upon light irradiation to thereby lose its dissolution inhibiting ability and enhance the alkali solubility of the novolak resin.

Many positive photoresists comprising a novolak resin and a photosensitive naphthoquinonediazide compound have been developed and put to practical use so far from the above-described standpoint. These photoresists have produced satisfactory results in the formation of resist patterns having line widths ranging about from 0.8 to 2 $\mu$m.

However, the degree of integration in integrated circuits is increasing more and more, and it has become necessary to form an ultrafine pattern having a line width of 0.5 $\mu$m or smaller in the production of semiconductor substrates for VLSIs and the like. For attaining the necessary resolution, the wavelengths of the light sources used for photolithography are decreasing more and more and, as a result, use of far ultraviolet rays and excimer laser beams (XeCl, KrF, ArF, etc.) has come to be investigated.

The prior art resists comprising a novolak and a naphthoquinonediazide compound are unsuitable for use in pattern formation by lithography using far ultraviolet rays or excimer laser beams, because the novolak and the naphthoquinonediazide exhibit intense absorption in the far ultraviolet region to render the light less apt to reach the resist bottom. Thus, the resist has low sensitivity to give only a tapered pattern.

One means for eliminating the above problem is the chemically amplified resist composition described in, e.g., U.S. Pat. No. 4,491,628 and European Patent 249,139. A chemically amplified positive resist composition is a pattern-forming material in which an acid generates in exposed areas upon irradiation with a radiation such as far ultraviolet rays and this acid catalyzes a reaction that makes the areas irradiated with the actinic rays and the unirradiated areas which are different in solubility in a developing solution to thereby form a pattern on a substrate.

Examples thereof include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625), with a silyl ester compound (see JP-A-60-10247), and with a silyl ether compound (see JP-A-60-37549 and JP-A-60-121446). These combinations exhibit high photosensitivity since they have a quantum efficiency exceeding 1 in principle.

Another means for eliminating the problem described hereinabove is a system which is stable over long at room temperature but decomposes upon heating in the presence of an acid to become alkali-soluble. Examples thereof include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642; *Polym. Eng. Sce.*, Vol. 23, p. 1012 (1983); *ACS. Sym.*, Vol. 242, p. 11 (1984); *Semiconductor World*, p. 91 (November 1987); *Macromolecules*, Vol. 21, p. 1475 (1988); and *SPIE*, Vol. 920, p. 42 (1988). Since these systems also have high sensitivity and exhibit reduced absorption in the deep UV region as compared with the naphthoquinonediazide/novolak resin systems, they can be effective systems for coping with the wavelength reduction in light sources.

The chemically amplified positive resists described above are roughly divided into two groups: three-component systems comprising an alkali-soluble resin, a compound which generates an acid upon exposure to a radiation (photo-acid generator), and a dissolution inhibitive compound for the alkali-soluble resin which has acid-decomposable groups; and two-component systems comprising a resin which decomposes upon reaction with an acid to become alkali-soluble and a photo-acid generator.

In these two-component or three-component, chemically amplified positive resists, the photo-acid generator is caused to generate an acid by exposure to light and the resists are then heat-treated and developed in the presence of the acid to obtain a resist pattern.

Known photo-acid generators for use in the above-described chemically amplified positive resists include N-imidosulfonates, N-oximesulfonates, o-nitrobenzylsulfonates, and pyrogallol trismethane-sulfonate. Typical compounds which have been used as photo-acid generators having a high photodecomposition efficiency and excellent image-forming properties are the sulfonium and iodonium salts of perfluorinated Lewis acids, e.g., $PF_6^-$, $AsF_6^-$, and $SbF_6^-$, described in, e.g., JP-A-59-45439, *Polym. Eng. Sci.*, 23, 1012 (1983), and *J. Polym. Sci., Polym. Chem. Ed.*, 18, 2677, 2697 (1980), and 22, 1789 (1984).

However, these prior art photo-acid generators, when used in resist materials for semiconductors, have a problem that the counter anions of the photo-acid generators cause pollution by phosphorus, arsenic, antimony, etc.

Used as a sulfonium or iodonium compound free from the pollution is the salt described in, e.g., JP-A-63-27829, JP-A-2-25850, JP-A-2-150848, JP-A-5-134414, and JP-A-5-232705, in which the counter anion is a trifluoromethanesulfonate anion.

It should, however, be noted that this prior art composition has a problem that since trifluoromethanesulfonic acid, which generates upon exposure to light, diffuses relatively rapidly in the resist film, the line width of the resist pattern which is being produced becomes narrower with the lapse of time from exposure to light to heat treatment or the resist pattern comes to have a T-top surface.

Although use of a toluenesulfonate anion as another counter anion for sulfonium or iodonium is described in, e.g., JP-A-2-25850, JP-A-2-150848, JP-A-5-5993, JP-A-6-43653, and JP-A-6-123972, this salt has a problem that since it has insufficient solubility in ordinary resist solvents, the addition amount thereof is limited, resulting in insufficient sensitivity.

Further, use of the sulfonium and iodonium salts of a benzenesulfonic, naphthalenesulfonic, or anthracenesulfonic acid having one linear alkyl or alkoxy group from the standpoint of also improving solvent solubility is described in JP-A-6-199770. However, this prior art resist also is insufficient in the reduction of diffusion of the generated acid in a resist film to pose the problem that the resist pattern line width becomes narrower with the lapse of time from exposure to light to heat treatment.

SUMMARY OF THE INVENTION

An object of the present invention is to eliminate the problems of the prior art techniques described above, specifically to provide a positive photosensitive composition which has a high photodecomposition efficiency and hence high sensitivity and is capable of giving an excellent resist pattern.

Another object of the present invention is to provide a positive photosensitive composition in which the acid generating upon exposure to light has reduced diffusibility and, hence, the resist pattern being formed neither suffers a line width decrease with the lapse of time from exposure to light to heat treatment nor comes to have a T-top surface.

Still another object of the present invention is to provide a positive photosensitive composition containing, as a photo-acid generator, a sulfonium compound which has improved solvent solubility and can be incorporated in the composition in an amount increased arbitrarily to thereby improve sensitivity.

As a result of intensive investigations made by the present inventors, they have found that the objects of the present invention are accomplished with a chemically amplified positive system containing the following specific compound which generates a sulfonic acid.

The present invention provides compositions having the following constitutions.

(1) A positive photosensitive composition comprising (i) a resin having group(s) capable of decomposing by the action of an acid to enhance solubility of the resin in an alkaline developing solution and (ii) a compound represented by formula (Ia) or (Ib) which is capable of generating a sulfonic acid upon irradiation with actinic rays or a radiation:

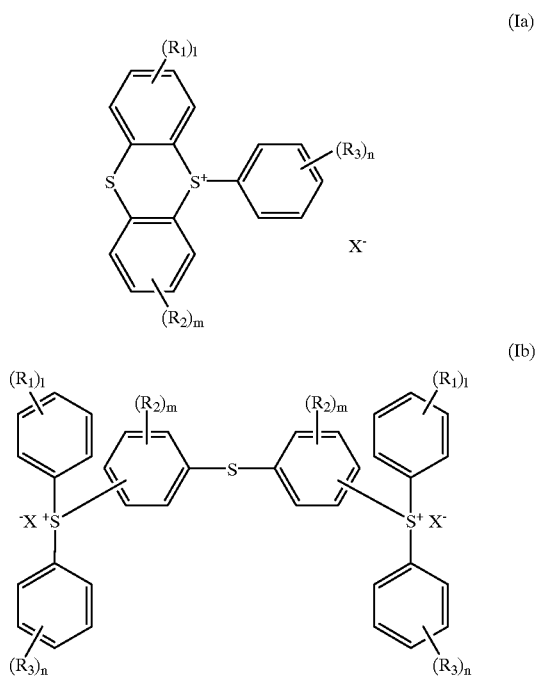

wherein $R_1$ to $R_3$, which may be the same or different, each represents a hydrogen atom, an alkyl group, a cycloalkyl group, an alkoxy group, a hydroxy group, a halogen atom, or a group represented by —S—$R_4$, where $R_4$ represents an alkyl group or an aryl group; $X^-$ represents the anion of a benzenesulfonic, naphthalenesulfonic, or anthracenesulfonic acid which has at least one group selected from the group consisting of linear, branched and cyclic, alkyl and alkoxy groups having 8 or more carbon atoms, or has at least two groups selected from the group consisting of linear, branched and cyclic, alkyl and alkoxy groups having 4 to 7 carbon atoms, or has at least three groups selected from the group consisting of linear and branched alkyl and alkoxy groups having 1 to 3 carbon atoms; and l, m, and n, which are the same or different, each represents an integer of 1 to 3, and when l, m, or n is 2 or 3, two of plural groups of each of $R_1$ to $R_3$ may be combined to form a ring composed of 5 to 8 atoms including a carbon ring, a heterocyclic ring, and an aromatic ring.

(2) The positive photosensitive composition of item (1) above, which contains a low-molecular acid-decomposable dissolution inhibitive compound having a molecular weight of 3,000 or lower which has groups decomposable by an acid and exhibits enhanced solubility in an alkaline developing solution by the action of an acid.

(3) The positive photosensitive composition of item (1) or (2), which contains a resin insoluble in water and soluble in an aqueous alkali solution.

(4) A positive photosensitive composition comprising (i) a compound represented by formula (Ia) or (Ib) described above which generates a sulfonic acid upon irradiation with actinic rays or a radiation, (ii) a low-molecular acid-decomposable dissolution inhibitive compound having a molecular weight of 3,000 or lower which has groups decomposable by an acid and exhibits enhanced solubility in an alkaline developing solution by the action of an acid, and (iii) a resin insoluble in water and soluble in an aqueous alkali solution.

By use of the compound represented by general formula (Ia) or (Ib) as a photo-acid generator as shown above, not only the chemically amplified resists are completely free from the problem caused during the lapse-of time from exposure to light to heat treatment, but also the acid generator has improved solvent solubility and a high photodecomposition efficiency. As a result, the resists have high photosensitivity and are capable of giving an excellent resist pattern.

DETAILED DESCRIPTION OF THE INVENTION

The present invention is explained below in detail.

[I] Photo-acid Generator of Formula (Ia) or (Ib)

Examples of the alkyl group represented by $R_1$ to $R_4$ in general formula (Ia) or (Ib) include an optionally substituted alkyl group having 1 to 4 carbon atoms, such as methyl, ethyl, propyl, n-butyl, sec-butyl, and t-butyl. Examples of the cycloalkyl group include an optionally substituted cycloalkyl group having 3 to 8 carbon atoms, such as cyclopropyl, cyclopentyl, and cyclohexyl. Examples of the alkoxy group include an optionally substituted alkoxy group having 1 to 4 carbon atoms, such as methoxy, ethoxy, hydroxyethoxy, propoxy, n-butoxy, isobutoxy, sec-butoxy, and t-butoxy. Examples of the halogen atom include fluorine, chlorine, bromine, and iodine. Examples of the aryl group include an optionally substituted aryl group having 6 to 14 carbon atoms, such as phenyl, tolyl, methoxyphenyl, and naphthyl.

Preferred examples of the substituent which $R_1$ to $R_4$ may contain include an alkoxy group having 1 to 4 carbon atoms, a halogen atom (fluorine, chlorine, and iodine), an aryl group having 6 to 10 carbon atoms, an alkenyl group having 2 to 6 carbon atoms, a cyano group, a hydroxy group, a carboxy group, an alkoxycarbonyl group, and a nitro group.

The sulfonium compound represented by general formula (Ia) or (Ib) used in the present invention has, as the counter anion $X^-$, the anion of a benzenesulfonic, naphthalenesulfonic, or anthracenesulfonic acid which has at least one group selected from the group consisting of linear, branched and cyclic, alkyl and alkoxy groups having 8 or more, preferably 10 or more carbon atoms, or has at least two groups selected from the group consisting of linear, branched and cyclic, alkyl and alkoxy groups having 4 to 7 carbon atoms, or has at least three groups selected from the group consisting of linear and branched, alkyl and alkoxy groups having 1 to 3 carbon atoms. Due to this counter anion, the acid which generates upon exposure to light (the benzenesulfonic, naphthalenesulfonic, or anthracenesulfonic acid having one or more groups as specified above) has reduced diffusibility and the sulfonium compound has improved solvent solubility. Especially from the standpoint of reducing diffusibility, branched or cyclic alkyl or alkoxy groups are preferred to linear alkyl or alkoxy groups as the substituents which the acid can have. In the case where the acid has one substituent, its diffusibility changes more considerably depending on whether the substituent is a linear group or a branched or cyclic group.

Examples of the alkyl group having 8 or more, preferably 8 to 20 carbon atoms include linear, branched or cyclic octyl, nonyl, decyl, undecyl, dodecyl, tridecyl, tetradecyl, and octadecyl.

Examples of the alkoxy group having 8 or more, preferably 8 to 20 carbon atoms include linear, branched or cyclic octyloxy, nonyloxy, decyloxy, undecyloxy, dodecyloxy, tridecyloxy, tetradecyloxy, and octadecyloxy.

Examples of the alkyl group having 4 to 7 carbon atoms include linear, branched, or cyclic butyl, pentyl, hexyl, and heptyl.

Examples of the alkoxy group having 4 to 7 carbon atoms include linear, branched, or cyclic butoxy, pentyloxy, hexyloxy, and heptyloxy.

Examples of the alkyl group having 1 to 3 carbon atoms include methyl, ethyl, n-propyl, and isopropyl.

Examples of the alkoxy group having 1 to 3 carbon atoms include methoxy, ethoxy, n-propoxy, and isopropoxy.

The aromatic sulfonic acid represented by $X^-$ may contain one or more substituents besides the specific substituents shown above. Examples of such optional substituents include a halogen atom (fluorine, chlorine, bromine, and iodine), an aryl group having 6 to 10 carbon atoms, a cyano group, a sulfido group, a hydroxy group, a carboxy group, and a nitro group.

When l, m, or n is 2 or 3, two of plural groups of each of $R_1$ to $R_3$ may be combined to form a ring composed of 5 to 8 atoms including a carbon ring, a heterocyclic ring, and an aromatic ring.

The total content of the compound represented by general formula (Ia) and/or (Ib) incorporated in the composition is preferably from 0.1 to 20% by weight, more preferably from 0.5 to 10% by weight, most preferably from 1 to 7% by weight, based on the total amount of all solid components of the composition.

The examples of the compounds represesented by formula (Ia) and (Ib), Compounds (Ia-1) to (Ia-30) and (Ib-1) to (Ib-28), are shown below, but the compounds represented by general formula (Ia) or (Ib) should not be construed as being limited thereto.

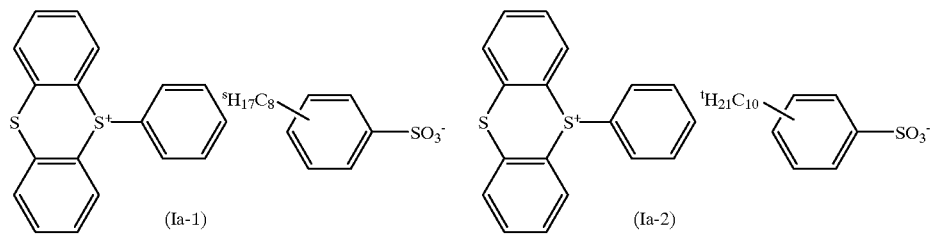

-continued
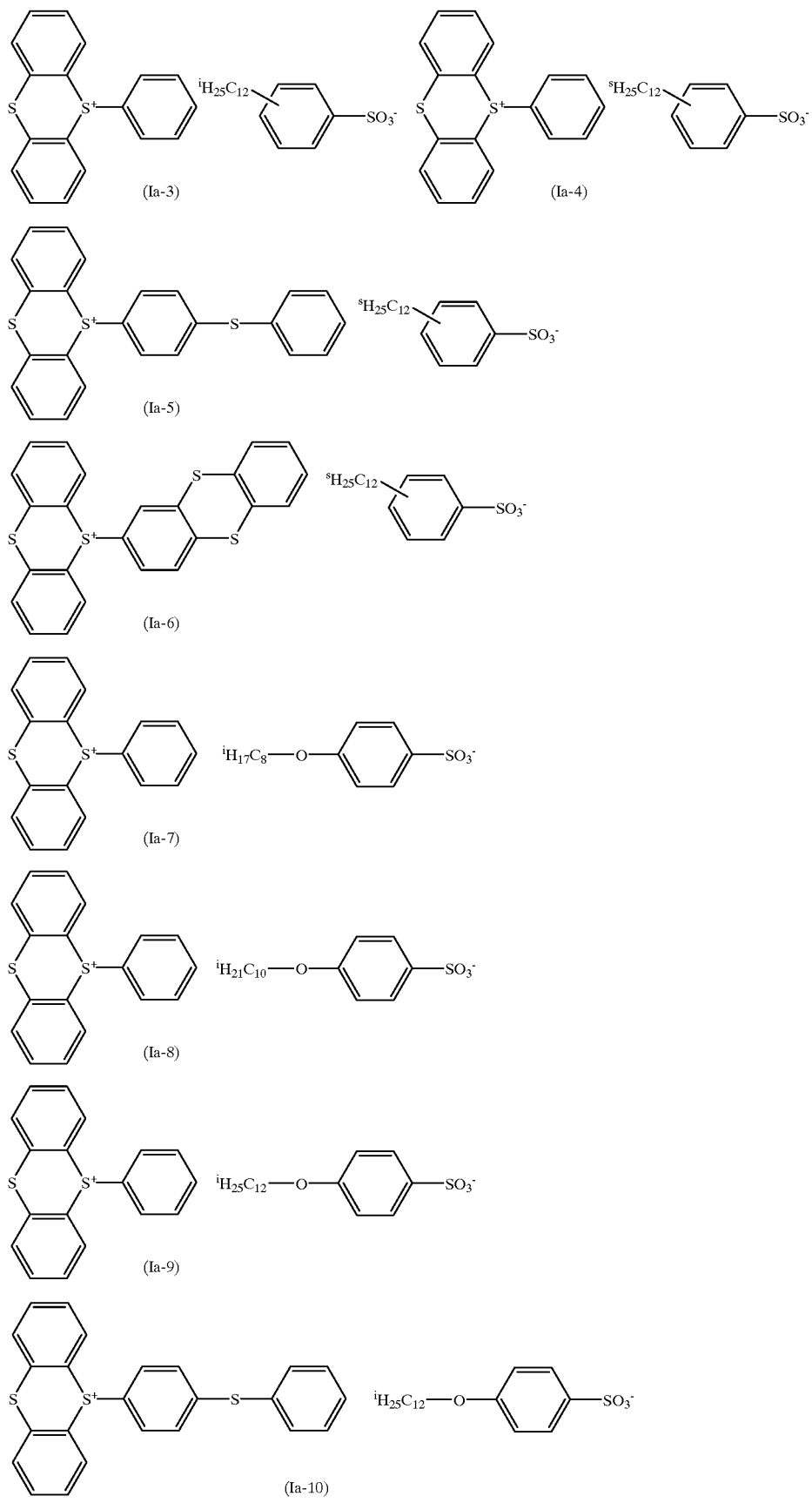

-continued
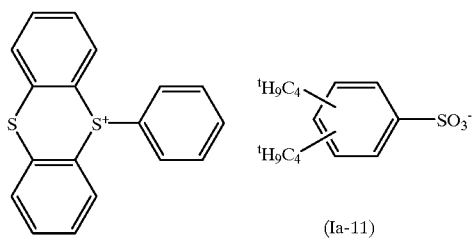
(Ia-11)
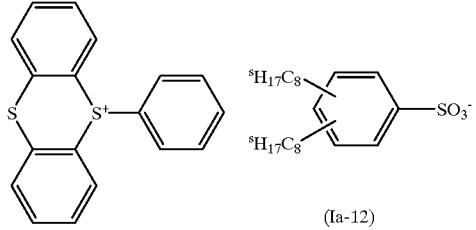
(Ia-12)
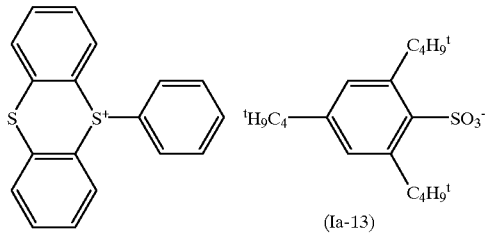
(Ia-13)
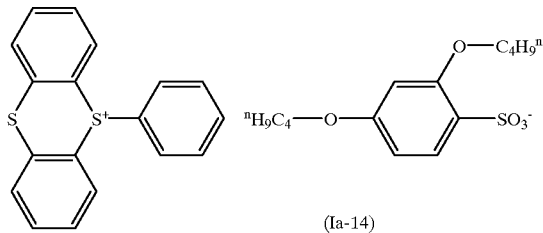
(Ia-14)
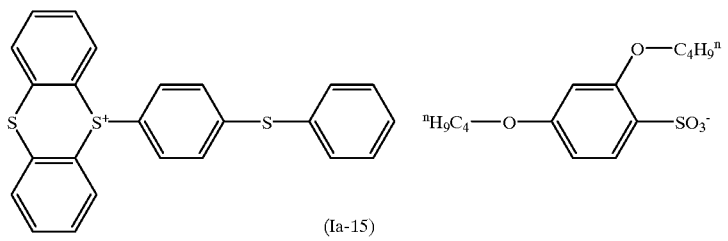
(Ia-15)
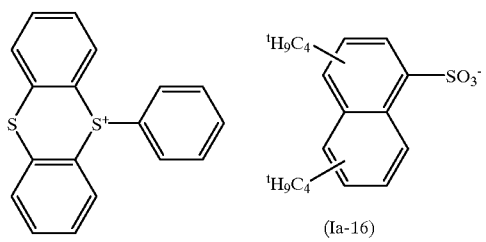
(Ia-16)
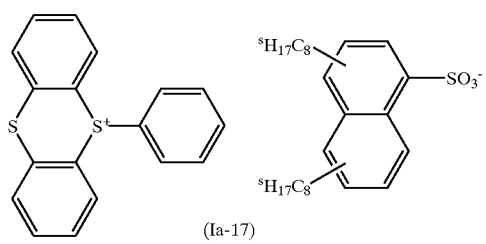
(Ia-17)

-continued
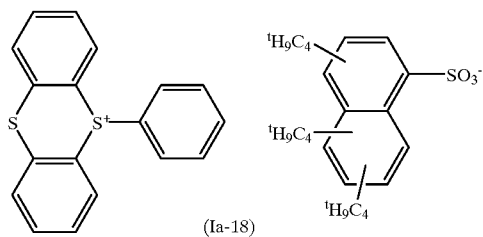
(Ia-18)
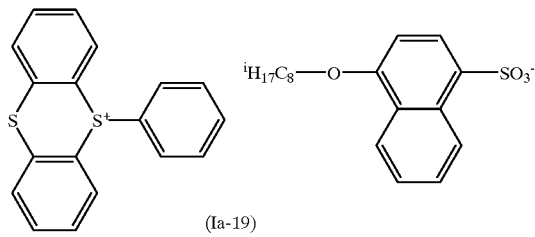
(Ia-19)
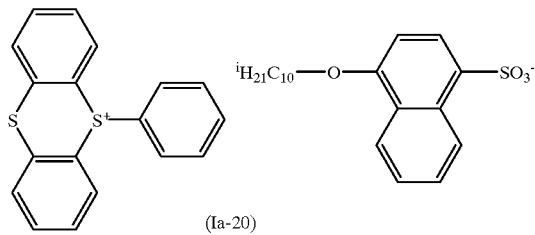
(Ia-20)
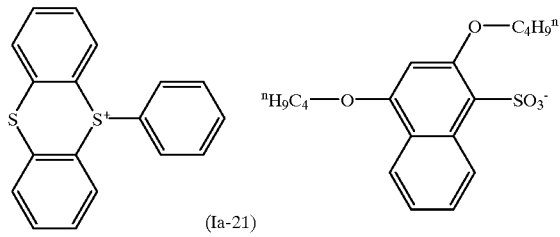
(Ia-21)
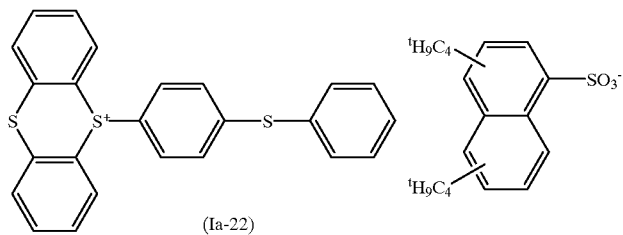
(Ia-22)
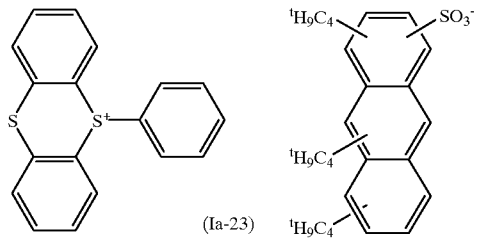
(Ia-23)

-continued
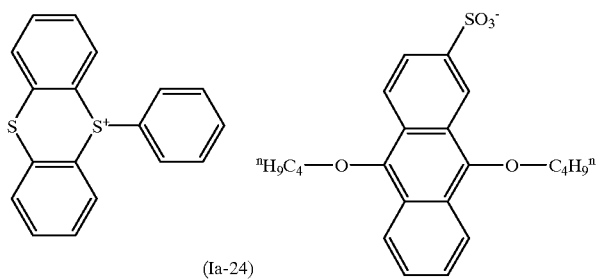
(Ia-24)
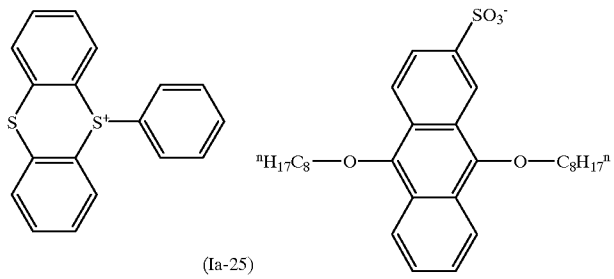
(Ia-25)
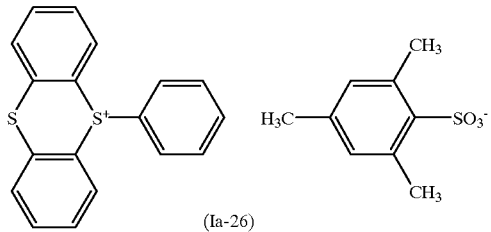
(Ia-26)
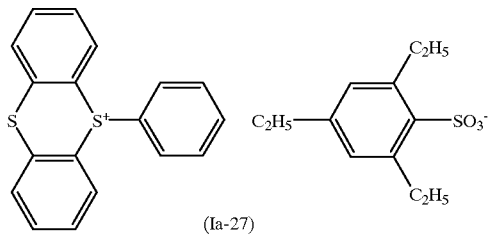
(Ia-27)
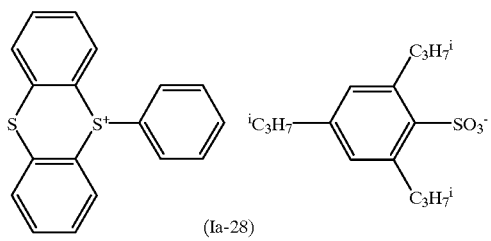
(Ia-28)
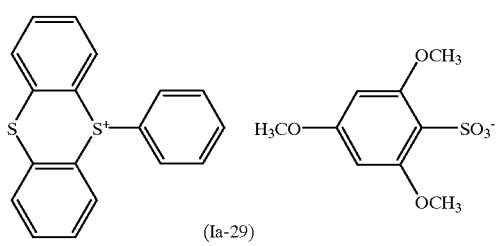
(Ia-29)

-continued
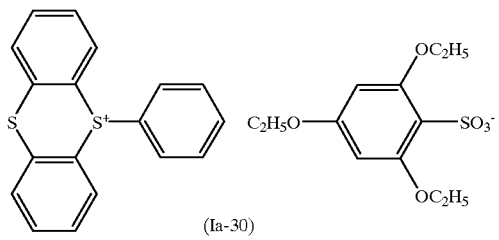
(Ia-30)
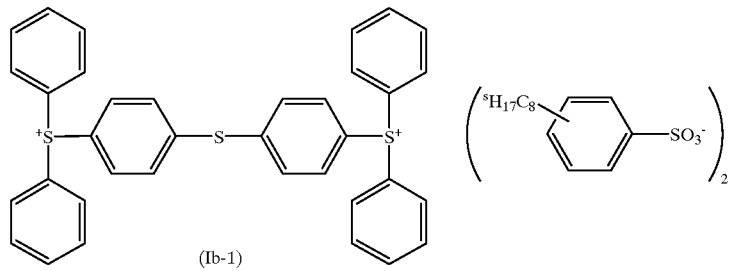
(Ib-1)
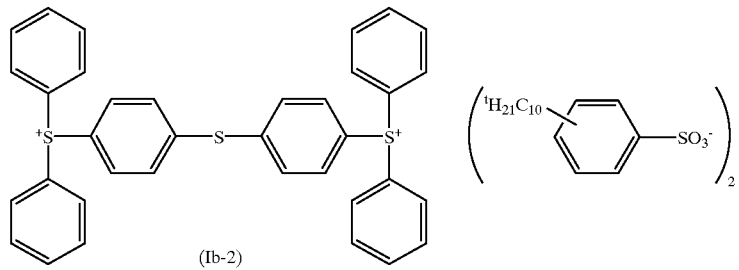
(Ib-2)
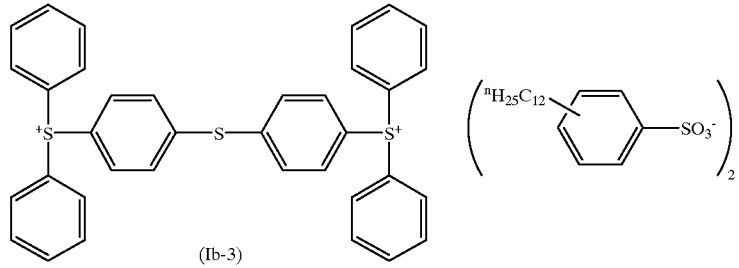
(Ib-3)
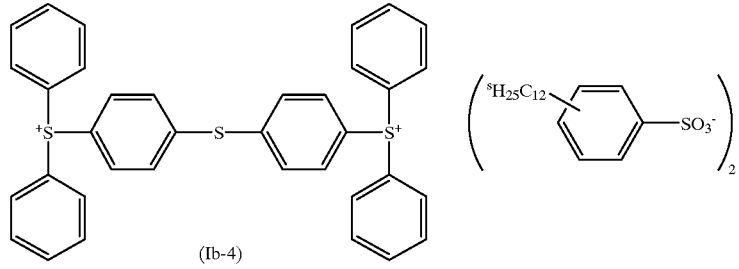
(Ib-4)
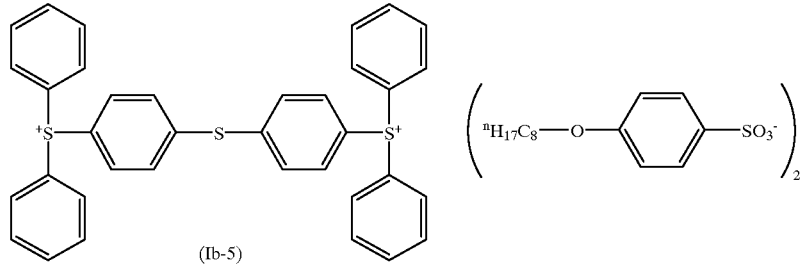
(Ib-5)

-continued
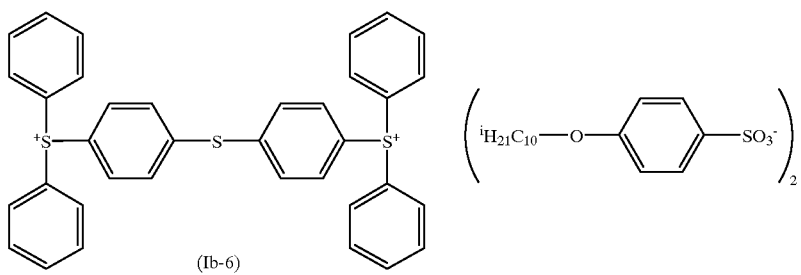
(Ib-6)
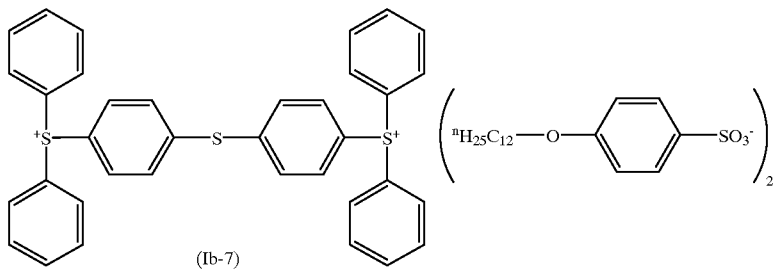
(Ib-7)
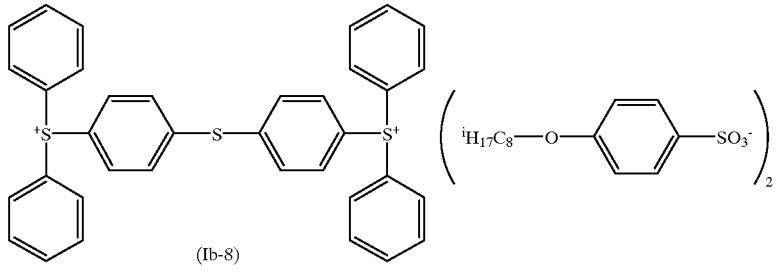
(Ib-8)
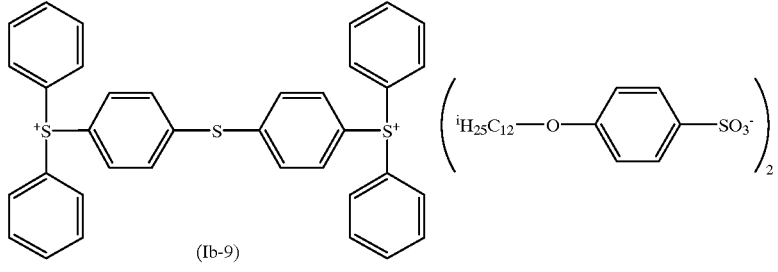
(Ib-9)
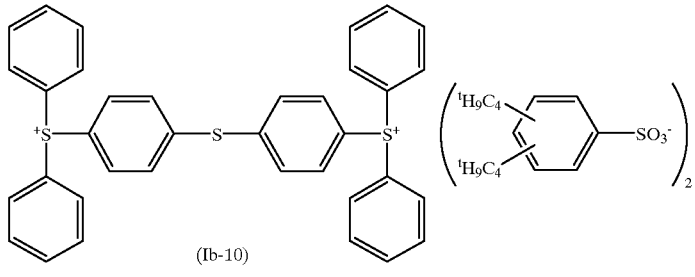
(Ib-10)
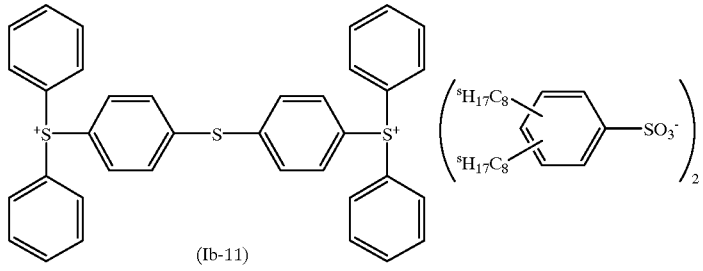
(Ib-11)

-continued
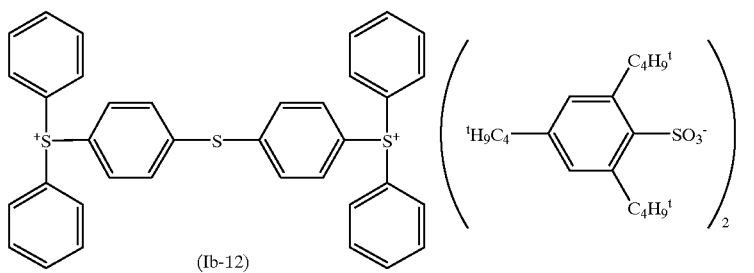
(Ib-12)
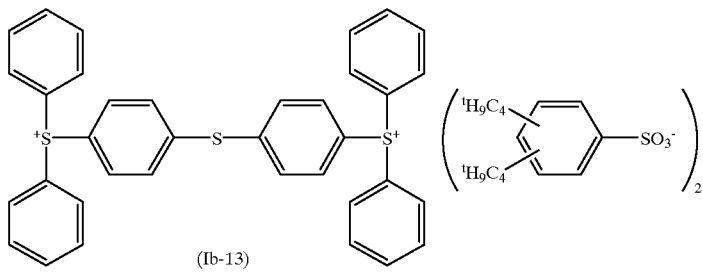
(Ib-13)
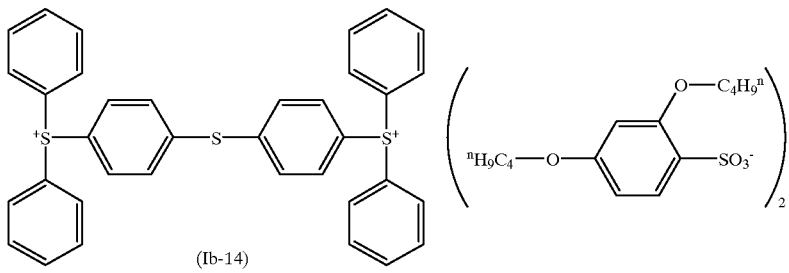
(Ib-14)
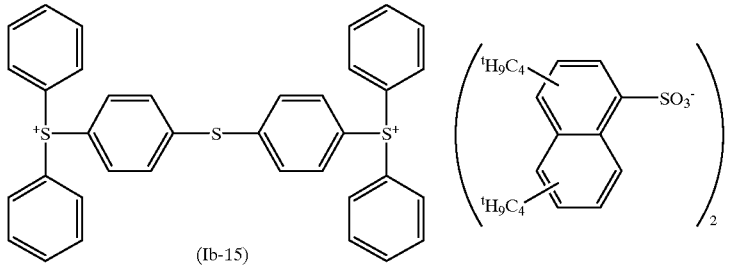
(Ib-15)
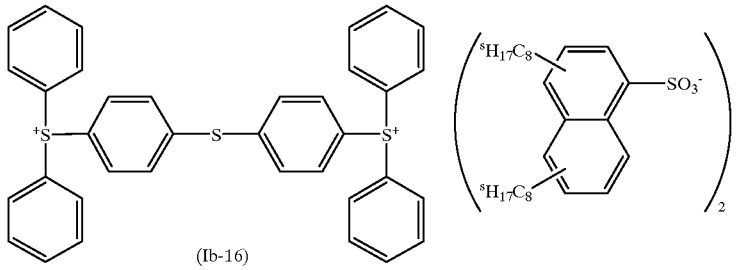
(Ib-16)
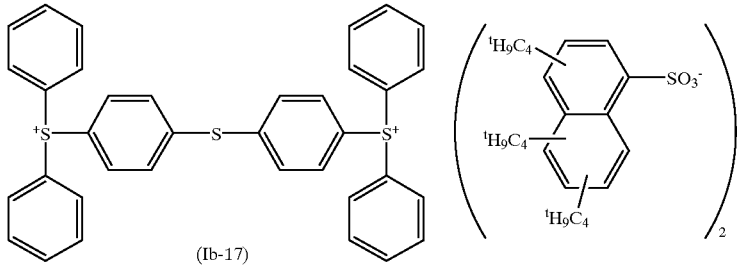
(Ib-17)

-continued
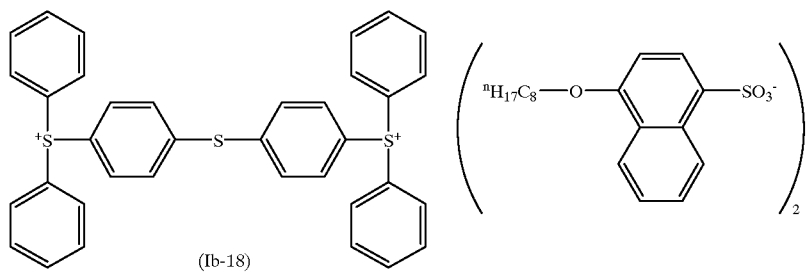
(Ib-18)
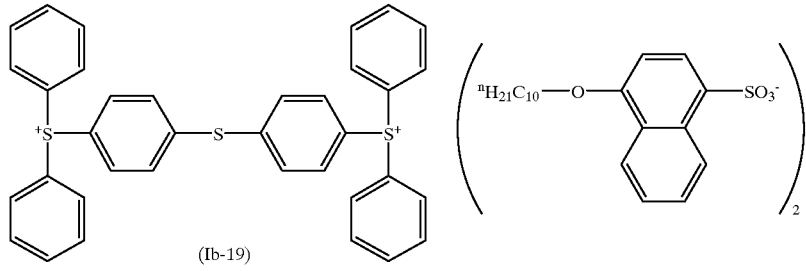
(Ib-19)
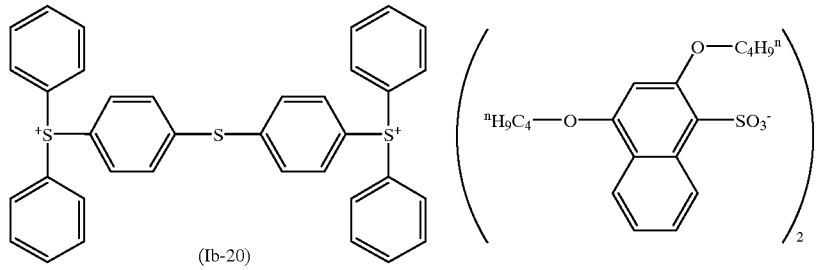
(Ib-20)
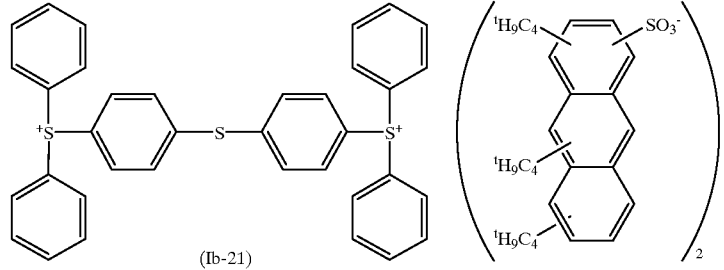
(Ib-21)
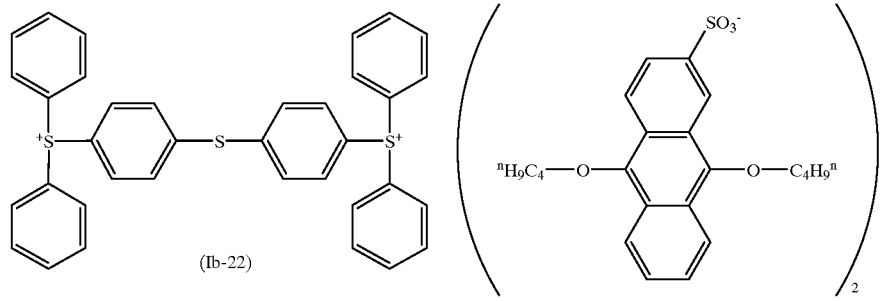
(Ib-22)
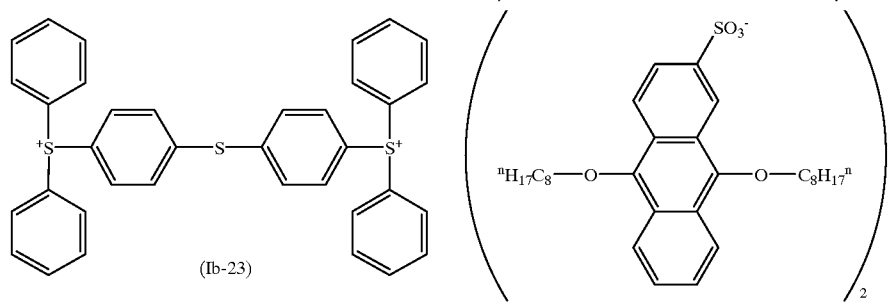
(Ib-23)

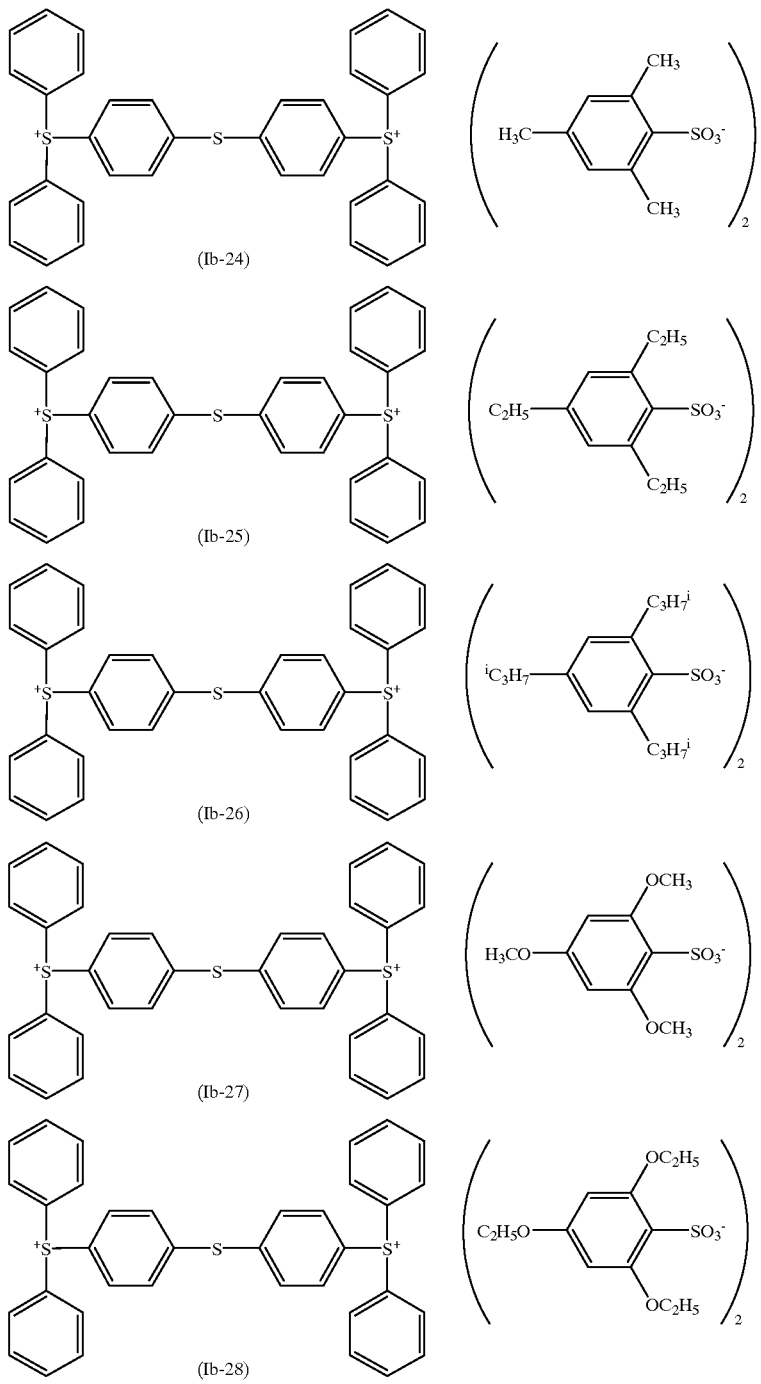

In the exemplified compounds given above, symbols n, s, t, and i indicate that the group is linear, secondary, tertiary, and branched, respectively.

The compound represented by general formula (Ia) or (Ib) can be synthesized, for example, by subjecting the corresponding Cl⁻ salt (the compound represented by general formula (Ia) or (Ib) wherein $X^-$ has been replaced by Cl⁻) to a salt interchange reaction with a compound represented by $X^-Y^+$ (wherein $X^-$ has the same meaning as in general formula (Ia) or (Ib), and $Y^+$ represents a cation, e.g., $H^+$, $Na^+$, $K^+$, $NH_4^+$, or $N(CH_3)_4^+$) in an aqueous solution.

[II] Other Usable Photo-acid Generators

In the present invention, the compound represented by general formula (Ia) or (Ib), which generates a sulfonic acid, may be used in combination with one or more other compounds which decompose upon irradiation with actinic rays or a radiation to generate an acid.

The proportion of the compound represented by general formula (Ia) or (Ib) according to the present invention to one or more other photo-acid generators usable therewith is generally from 100/0 to 20/80, preferably from 90/10 to 40/60, more preferably from 80/20 to 50/50, by mole.

Examples of such photo-acid generators usable in combination with the specific photo-acid generator include photoinitiators for cationic photopolymerization, photoinitiators for radical photopolymerization, photodecolorants for dyes, optical color changers, and known compounds which generate an acid by the action of light and are used in microresists, etc. These optional photo-acid generators may be suitably used either alone or as a mixture of two or more thereof.

Specific examples thereof include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Patent 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p. 478 Tokyo, October (1988), and U.S. Pat. Nos. 4,069,055 and 4,069,056; the iodonium salts described in, e.g., J. V. Crivello et al., *Macromolecules*, 10 (6), 1307 (1977), *Chem. & Eng. News*, Nov. 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al.,*J. Polymer Sci., Polymer Chem. Ed.*, 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, and German Patents 2,904,626, 3,604,580, and 3,604,581; the selenonium salts described in, e.g., J. V. Crivello et al., *Macromolecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p. 478 Tokyo, October (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; the photo-acid generators having an o-nitrobenzyl type protective group described in, e.g., S. Hayase et al.,*J. Polymer Sci.*, 25, 753 (1987), E. Reichmanis et al., *J. Polymer Sci., Polymer Chem. Ed.*, 23, 1 (1985), Q. Q. Zhu et al.,*J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints,* Japan, 37 (3), European Patents 0,199,672, 84,515, 199,672, 044, 115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9,625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

Of the optionally usable compounds enumerated above which generate an acid upon irradiation with actinic rays or a radiation, especially effective compounds are explained below.

(1) Trihalomethyl-substituted oxazole derivatives represented by the following general formula (PAG1) and trihalomethyl-substituted s-triazine derivatives represented by the following general formula (PAG2).

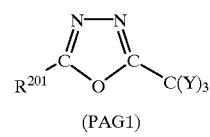

(PAG1)

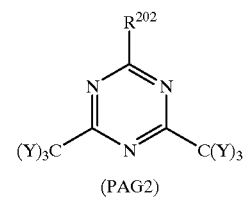

(PAG2)

In the above formulae, $R^{201}$ represents a substituted or unsubstituted aryl or alkenyl group; $R^{202}$ represents a substituted or unsubstituted aryl, alkenyl, or alkyl group or —C(Y)$_3$; and Y represents a chlorine or bromine atom.

Specific examples thereof are given below, but the compounds represented by general formula (PAG1) or (PAG2) should not be construed as being limited thereto.

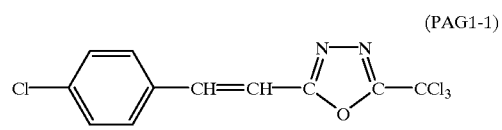

(PAG1-1)

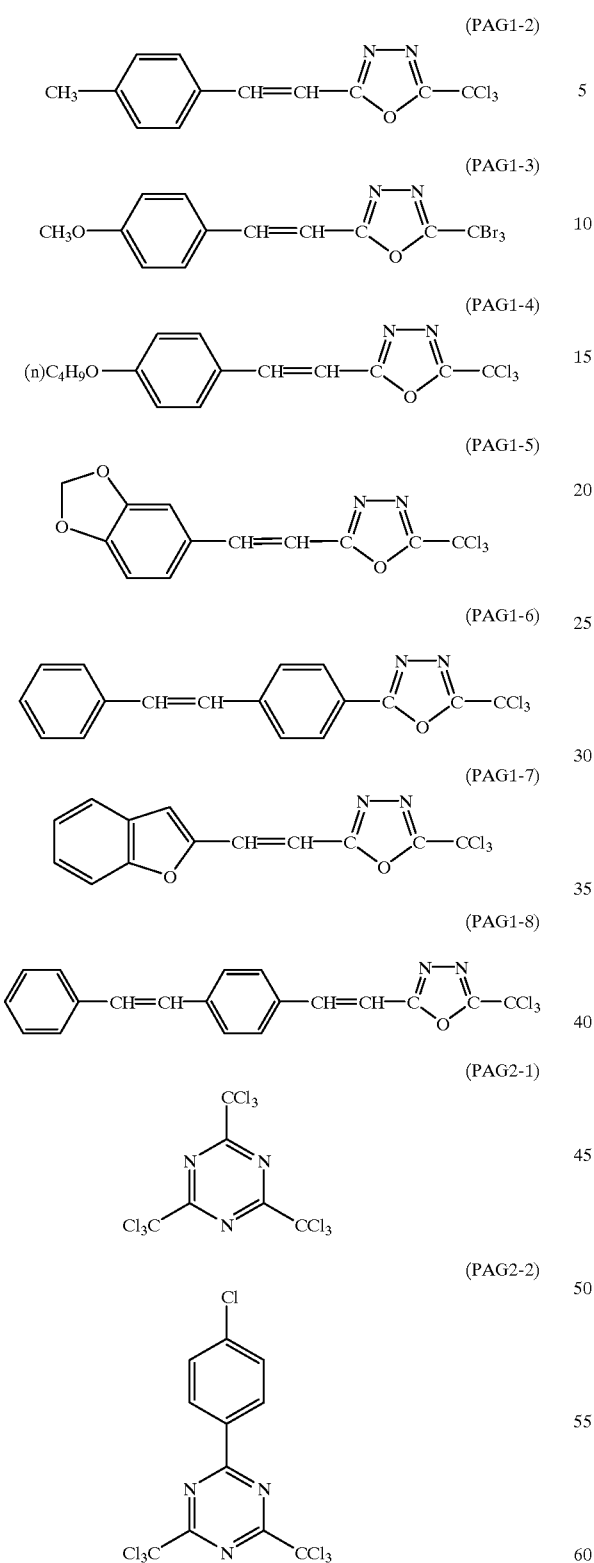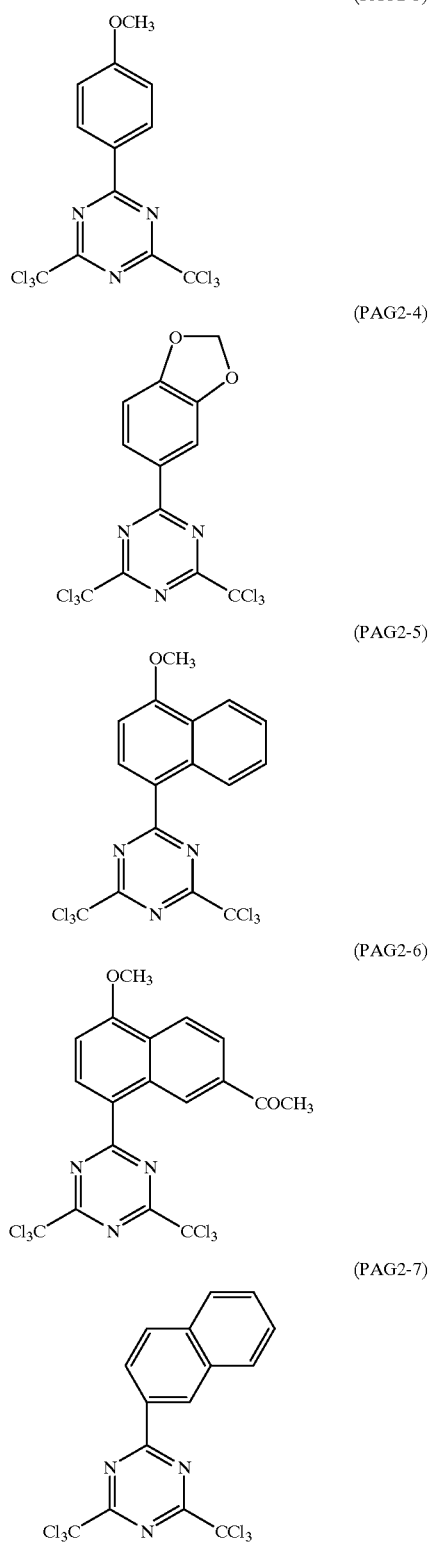

(PAG2-8)

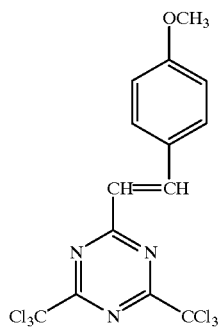

(PAG2-9)

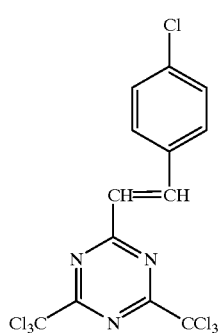

(PAG2-10)

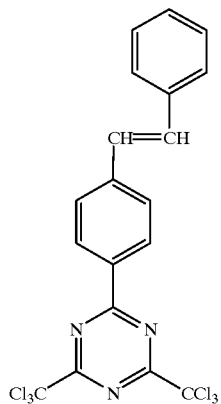

(2) Iodonium salts represented by the following general formula (PAG3) and sulfonium salts represented by the following general formula (PAG4).

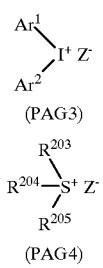

(PAG3)

(PAG4)

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion, specifically a perfluoroalkanesulfonate anion, e.g., $CF_3SO_3^-$, or a pentafluorobenzenesulfonate anion.

Two of $R^{203}$, $R^{204}$, and $R^{205}$ may be bonded to each other through a single bond or substituent thereof. $Ar^1$ and $Ar^2$ may be bonded to each other likewise.

Specific examples thereof are given below, but the compounds represented by general formula (PAG3) or (PAG4) should not be construed as being limited thereto.

(PAG3-1)

(PAG3-2)

(PAG3-3)

(PAG3-4)

(PAG3-5)

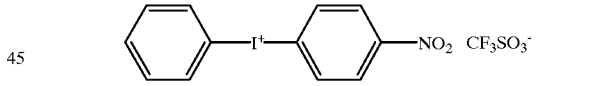

(PAG3-6)

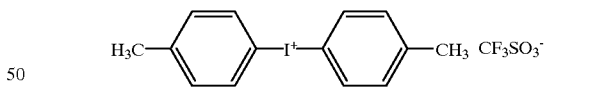

(PAG3-7)

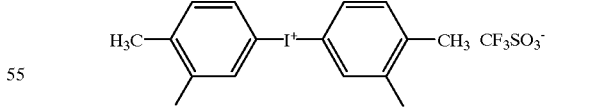

(PAG3-8)

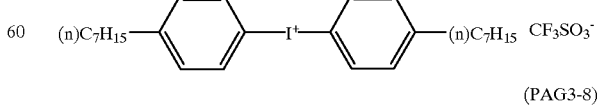

(PAG3-9) 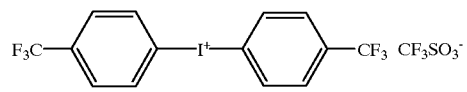
(PAG3-10) 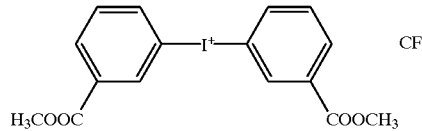
(PAG3-11) 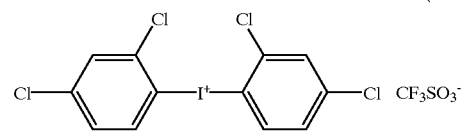
(PAG3-12) 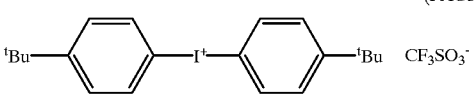
(PAG3-13) 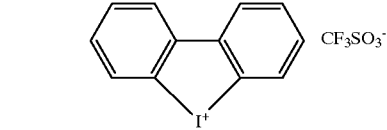
(PAG3-14) 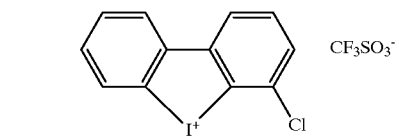
(PAG3-15) 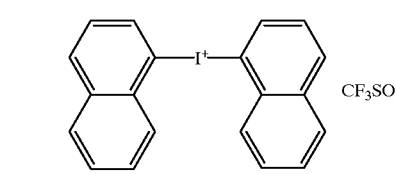
(PAG3-16) 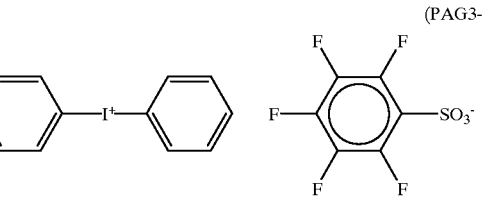
(PAG3-17) 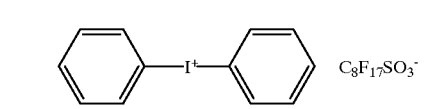
(PAG4-1) 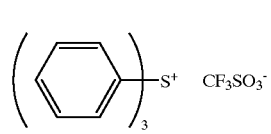
(PAG4-2) 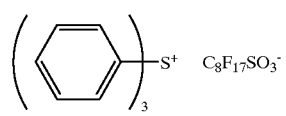
(PAG4-3) 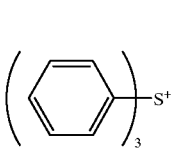 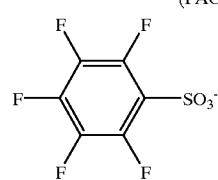
(PAG4-4) 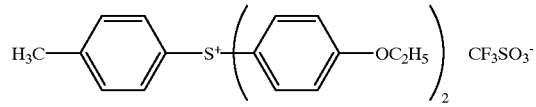
(PAG4-5) 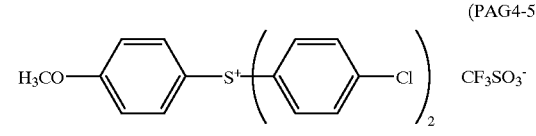
(PAG4-6) 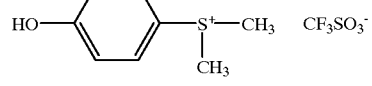
(PAG4-7) 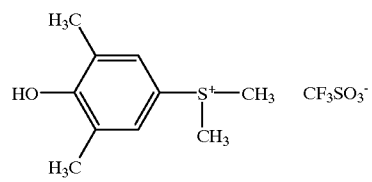
(PAG4-8) 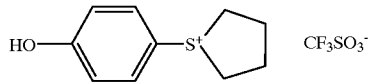
(PAG4-9) 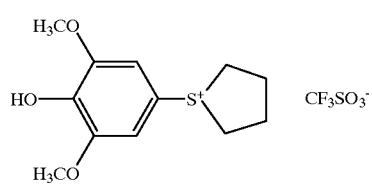
(PAG4-10) 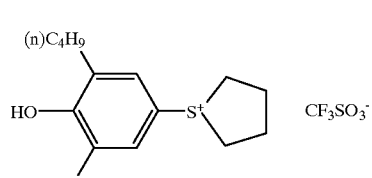
(PAG4-11) 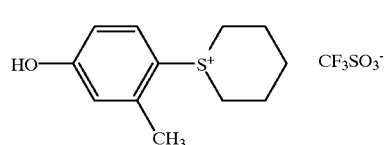

The onium salts represented by general formulae (PAG3) and (PAG4) are known. They can be synthesized, for example, by the methods described in, e.g., J. W. Knapczyk et al., *J. Am. Chem. Soc.,* 91, 145 (1969), A. L. Maycok et al., *J. Org. Chem.,* 35, 2535 (1970), E. Goethas et al., *Bull. Soc. Chem. Belg.,* 73, 546 (1964), H. M. Leicester, *J. Ame. Chem. Soc.,* 51, 3587 (1929), J. V. Crivello et al., *J. Polym. Chem. Ed.,* 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

$$Ar^3—SO_2—SO_2—Ar^4$$
(PAG5)

$$R^{206}—SO_2—O—N\begin{pmatrix}A\end{pmatrix}$$
(PAG6)

In the above formulae, $Ar^3$ and $Ar^4$ each independently represents a substituted or unsubstituted aryl group; $R^{206}$ represents a substituted or unsubstituted alkyl or aryl group;

and A represents a substituted or unsubstituted alkylene, alkenylene, or arylene group.
Specific examples thereof are given below, but the compounds represented by general formula (PAG5) or (PAG6) should not be construed as being limited thereto.
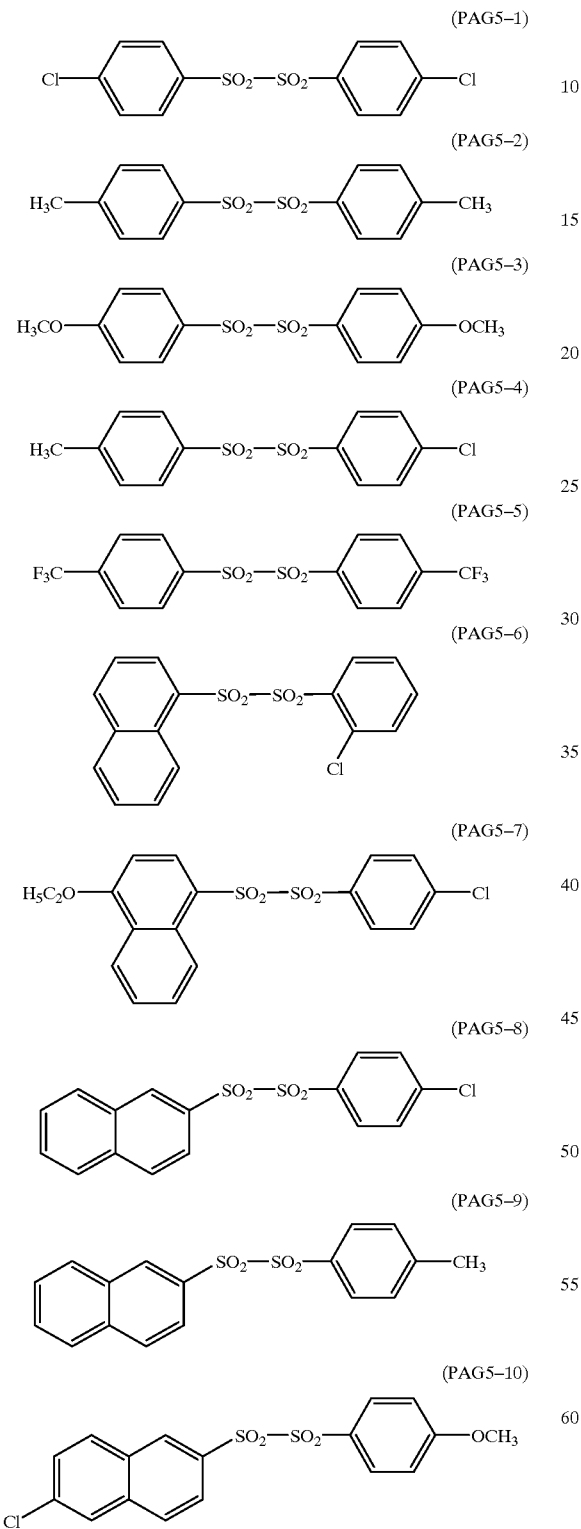

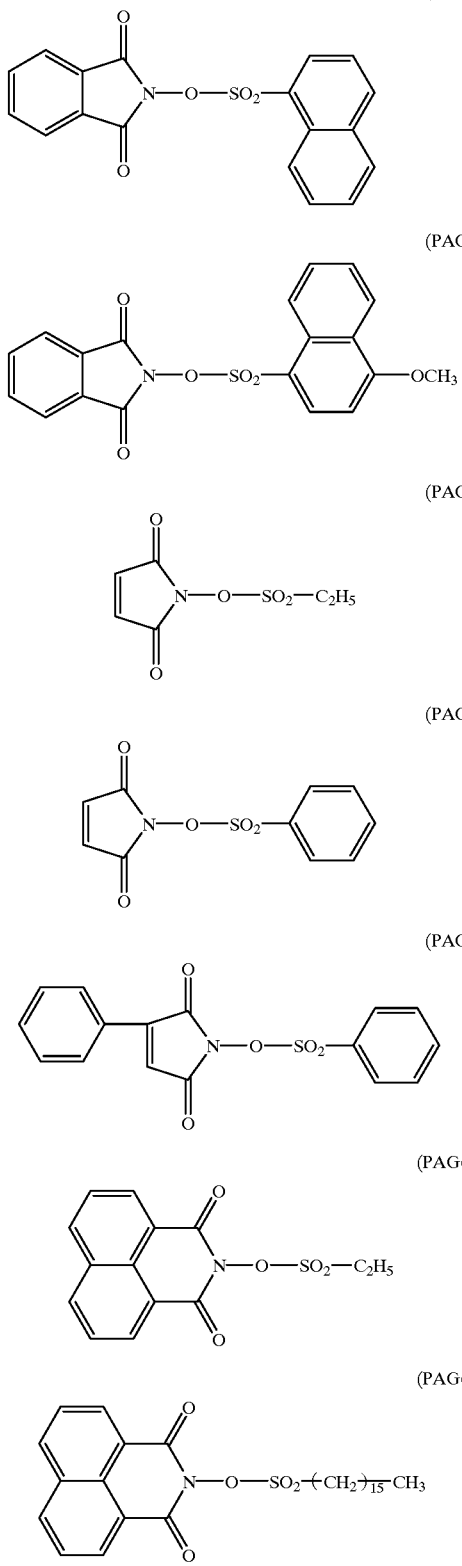
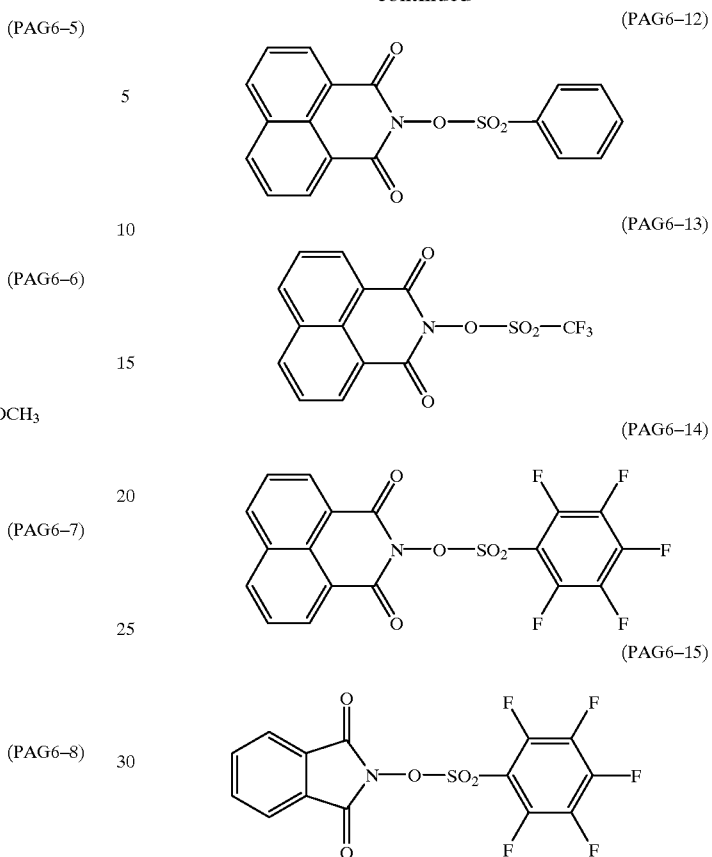

[III] Resin Having Groups Decomposing by the Action of Acid to Enhance Solubility in Alkaline Developing Solution The resin which has groups decomposing by the action of an acid to enhance solubility of the resin in an alkaline developing solution and is used in the chemically amplified resist according to the present invention is a resin having acid-decomposable groups in the backbone and/or side chains thereof, preferably in side chains thereof.

The groups which is capable of decomposing by the action of an acid are preferably represented by —COOA$^0$ or —O—B$^0$. Examples of groups containing those groups include groups represented by —R$^0$—COOA$^0$ or —Ar—O—B$^0$.

A$^0$ represents —C(R$^{01}$)(R$^{02}$)(R$^{03}$), —Si(R$^{01}$)(R$^{02}$)(R$^{03}$), or —C(R$^{04}$)(R$^{05}$)—O—R$^{06}$, and B$^0$ represents —A$^0$ or —CO—O—A$^0$. (R$^0$, R$^{01}$ to R$^{06}$, and Ar have the same meanings as will be defined later.)

Desirable examples of the acid-decomposable groups include silyl ether groups, cumyl ester groups, acetal groups, tetrahydropyranyl ether groups, tetrahydropyranyl ester groups, enol ether groups, enol ester groups, tertiary alkyl ether groups, tertiary alkyl ester groups, and tertiary alkyl carbonate groups. Preferred of these are tertiary alkyl ester groups, tertiary alkyl carbonate groups, cumyl ester groups, acetal groups, and tetrahydropyranyl ether groups.

In the case where these acid-decomposable groups are bonded as side chains to a resin, this resin is an alkali-soluble resin having —OH or —COOH groups, preferably —R$^0$—

COOH or —Ar—OH groups, as side chains. Examples of the alkali-soluble resin will be given later.

These alkali-soluble resins have an alkali dissolution rate of preferably 170 Å/sec or higher, more preferably 330 Å/sec or higher, as measured in 0.261 N tetramethylammonium hydroxide (TMAH) at 23° C.

Desirable from the standpoint of attaining a rectangular profile is an alkali-soluble resin having a high transmittance to far-ultraviolet or excimer laser beam. A 1 μm-thick film of the resin preferably has a transmittance of from 20 to 90% at a wavelength of 248 nm.

Especially preferred alkali-soluble resins from the above standpoint are poly(o-, m-, or p-hydroxystyrene), copolymers thereof, hydrogenated poly(hydroxystyrene)s, halogen- or alkyl-substituted poly(hydroxystyrene)s, partially O-alkylated or O-acylated poly(hydroxystyrene)s, styrene/hydroxystyrene copolymers, α-methylstyrene/hydroxystyrene copolymers, and hydrogenated novolak resins.

The resin having acid-decomposable groups for use in the present invention can be obtained by reacting an alkali-soluble resin with a precursor for acid-decomposable groups or by copolymerizing a monomer for an alkali-soluble resin which monomer has an acid-decomposable group with any of various monomers, as disclosed in, e.g., European Patent 254,853, JP-A-2-25850, JP-A-3-223860, and JP-A-4-251259.

Specific examples of the resin having acid-decomposable groups which is used in the present invention are given below, but that resin should not be construed as being limited thereto.

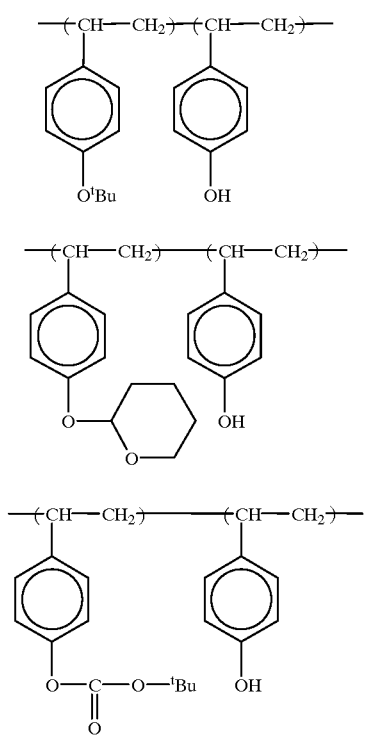

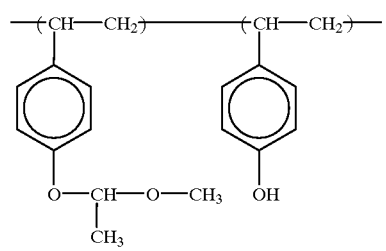

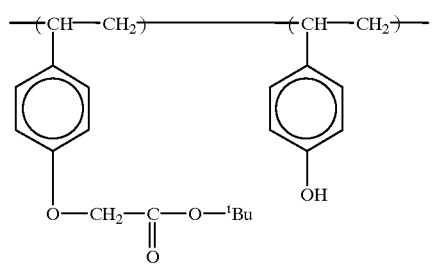

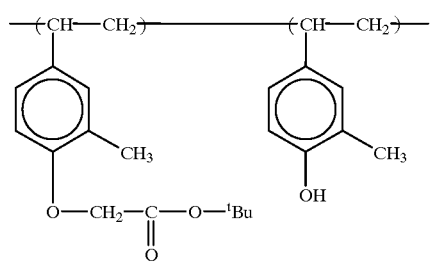

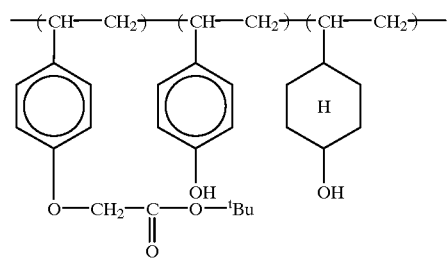

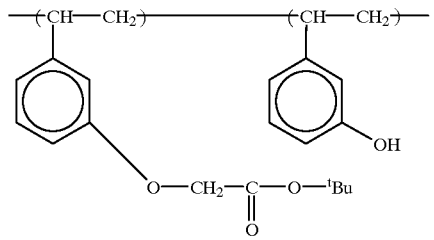

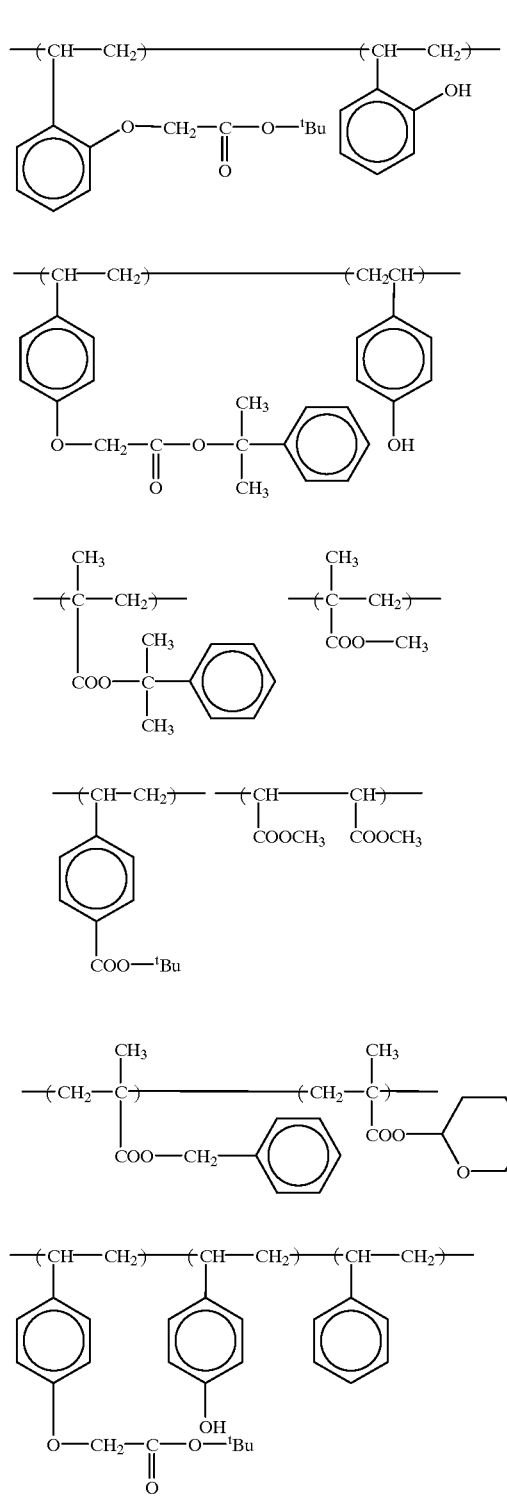
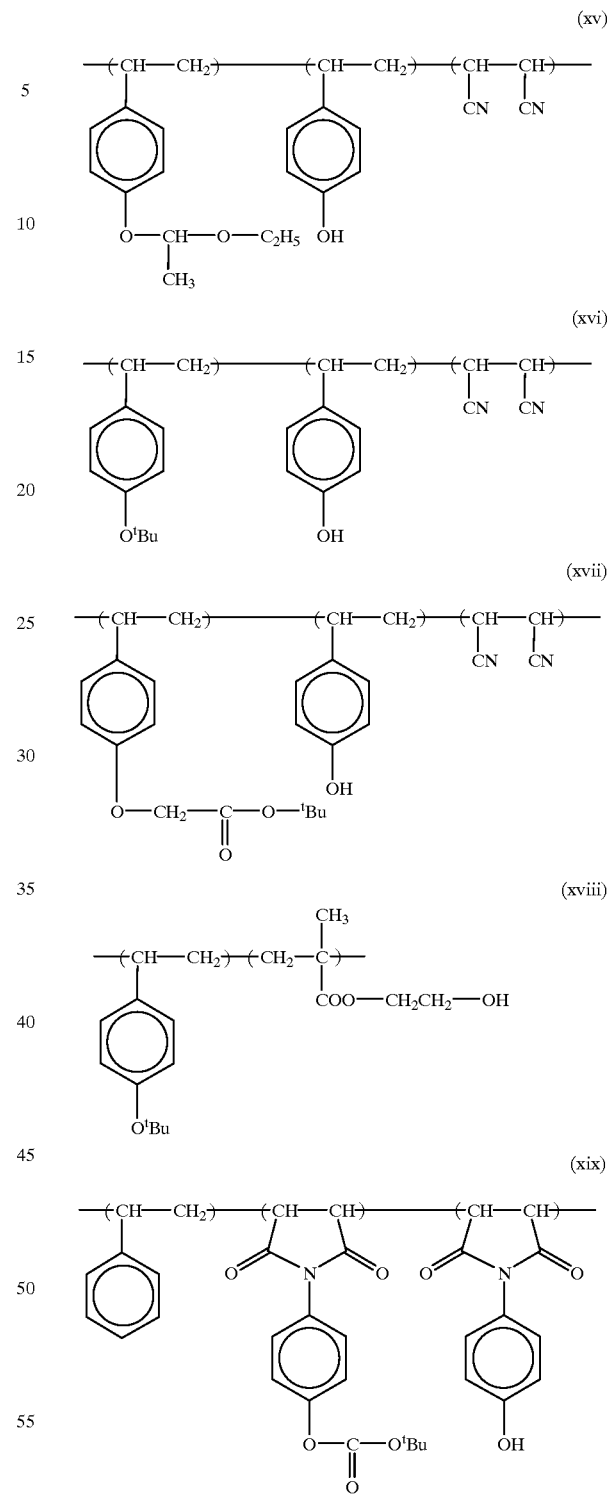

-continued

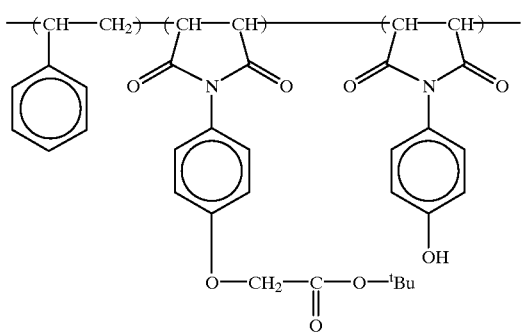

(xx)

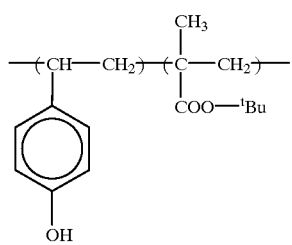

(xxi)

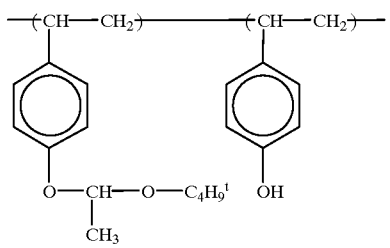

(xxii)

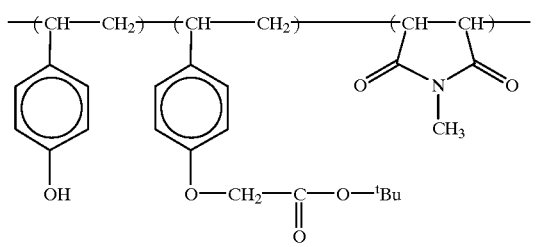

(xxiii)

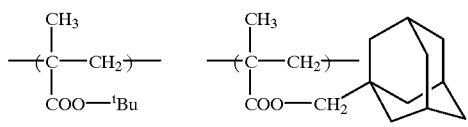

(xxiv)

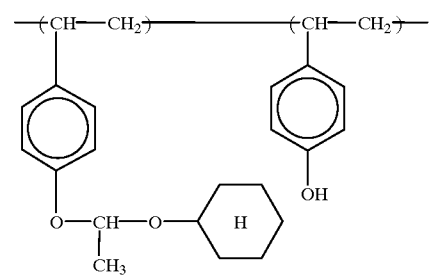

(xxv)

The content of acid-decomposable groups is expressed as B/(B+S), wherein B is the number of the acid-decomposable groups in the resin and S is the number of alkali-soluble groups not protected by the acid-decomposable groups. The content thereof is preferably from 0.01 to 0.5, more preferably from 0.05 to 0.40, most preferably from 0.05 to 0.30. If the value B/(B+S) is larger than 0.5, such a resin is liable to suffer film shrinkage after post-exposure bake, has insufficient substrate adhesion, and causes a scum. On the other hand, if it is smaller than 0.01, such a resin may result in a resist pattern having an extreme standing wave mark in the side walls thereof.

The weight-average molecular weight ($M_w$) of the resin having acid-decomposable groups is desirably from 2,000 to 200,000. If the $M_w$ thereof is lower than 2,000, the film reduction at unexposed parts during development is liable to be large. If the $M_w$ thereof exceeds 200,000, there is a possibility that the alkali-soluble resin itself has too low a rate of dissolution in an alkali, resulting in reduced sensitivity. The preferred range of the $M_w$ of the resin is from 5,000 to 100,000, especially from 8,000 to 50,000. The degree of dispersion ($M_w/M_n$) of the resin is preferably from 1.0 to 4.0, more preferably from 1.0 to 2.0, most preferably from 1.0 to 1.6. The lower the degree of dispersion, the better the heat resistance and image-forming properties (pattern profile, defocus latitude, etc.).

Weight-average molecular weight herein means that determined by gel permeation chromatography and reduced to polystyrene.

The resin having acid-decomposable groups, for use in the present invention, may be a mixture of two or more polymers each having acid-decomposable groups. The use amount of this resin in the present invention is generally from 40 to 99% by weight, desirably from 60 to 95% by weight, based on the total amount of the photosensitive composition (excluding the solvent). An alkali-soluble resin having no acid-decomposable groups may be further incorporated into the composition for the purpose of adjusting alkali solubility.

An acid-decomposable low-molecular dissolution inhibitive compound which will be described later is preferably used in combination with the acid generator and the resin having acid-decomposable groups.

In this case, the content of the dissolution inhibitive compound is generally from 3 to 45% by weight, preferably from 5 to 30% by weight, more preferably from 10 to 20% by weight, based on the total amount of the photosensitive composition (excluding the solvent).

[IV] Alkali-soluble Resin for Use in the Invention

A resin insoluble in water and soluble in an aqueous alkali solution (hereinafter referred to also as "alkali-soluble resin") is preferably used in the present invention.

Examples of the alkali-soluble resin for use in the present invention include novolak resins, hydrogenated novolak resins, acetone-pyrogallol resins, poly(o-hydroxystyrene), poly(m-hydroxystyrene), poly(p-hydroxystyrene), hydrogenated poly(hydroxystyrene)s, halogen- or alkyl-substituted poly(hydroxystyrene)s, hydroxystyrene/N-substituted maleimide copolymers, o/p- and m/p-hydroxystyrene copolymers, partially O-alkylated poly(hydroxystyrene)s [e.g., O-methylated, O-(1-methoxy)ethylated, O-(1-ethoxy) ethylated, O-2-tetrahydropyranylated, and O-(t-butoxycarbonyl)methylated poly(hydroxystyrene)s having a degree of substitution of from 5 to 30 mol % of the hydroxyl groups], O-acylated poly(hydroxystyrene)s [e.g., O-acetylated and O-(t-butoxy)carbonylated poly (hydroxystyrene)s having a degree of substitution of from 5 to 30 mol % of the hydroxyl groups], styrene/maleic anhydride copolymers, styrene/hydroxystyrene copolymers, α-methylstyrene/hydroxystyrene copolymers, carboxylated methacrylic resins, and derivatives thereof. However, the alkali-soluble resin for use in the present invention should not be construed as being limited to these examples.

Especially preferred alkali-soluble resins are novolak resins, poly(o-hydroxystyrene), poly(m-hydroxystyrene), poly(p-hydroxystyrene), copolymers of these hydroxystyrenes, alkyl-substituted poly(hydroxystyrene)s, partially O-alkylated or O-acylated poly(hydroxystyrene)s, styrene/hydroxystyrene copolymers, and α-methylstyrene/hydroxystyrene copolymers. The novolak resins are obtained by addition-condensing one or more given monomers as the main ingredient with one or more aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred of these is formaldehyde.

These aldehydes may be used alone or in combination of two or more thereof. Examples of the acid catalyst include hydrochloric acid, sulfuric acid, formic acid, acetic acid, and oxalic acid.

The weight-average molecular weight of the thus-obtained novolak resin is desirably from 1,000 to 30,000. If the weight-average molecular weight thereof is lower than 1,000, the film reduction at unexposed parts during development is liable to be large. If the weight-average molecular weight thereof exceeds 30,000, the developing rate may be too low. The especially preferred range of the molecular weight of the novolak resin is from 2,000 to 20,000.

The poly(hydroxystyrene)s and derivatives and copolymers thereof shown above as alkali-soluble resins other than novolak resins each has a weight-average molecular weight of 2,000 or higher, preferably from 5,000 to 200,000, more preferably from 10,000 to 100,000. From the standpoint of obtaining a resist film having improved heat resistance, the weight-average molecular weight thereof is desirably 25,000 or higher.

Weight-average molecular weight herein means that determined by gel permeation chromatography and calculated for standard polystyrene.

In the present invention, those alkali-soluble resins may be used as a mixture of two or more thereof. Use amount of the alkali-soluble resins is generally from 40 to 97% by weight, desirably from 60 to 90% by weight, based on the total amount of the photosensitive composition (excluding the solvent).

[V] Low-molecular Acid-decomposable Dissolution Inhibitive Compound for Use in the Invention A low-molecular acid-decomposable dissolution inhibitive compound is preferably used in the present invention.

The acid-decomposable dissolution inhibitive compound for use in the present invention is a compound which has at least two acid-decomposable groups in the molecular structure and in which the two acid-decomposable groups most apart from each other are separated by at least 8 bonding atoms.

In the present invention, the acid-decomposable dissolution inhibitive compound is desirably either a compound which has at least two acid-decomposable groups in the molecular structure and in which the two acid-decomposable groups most apart from each other are separated by at least 10, preferably at least 11, more preferably at least 12 bonding atoms, or a compound which has at least three acid-decomposable groups and in which the two acid-decomposable groups most apart from each other are separated by at least 9, preferably at least 10, more preferably at least 11 bonding atoms. The upper limit of the bonding atoms by which the two acid-decomposable groups most apart from each other are separated is preferably 50, more preferably 30.

In the case where the acid-decomposable dissolution inhibitive compound has three or more, desirably four or more acid-decomposable groups, the compound exhibits an extremely improved dissolution inhibiting effect on the alkali-soluble resin when the acid-decomposable groups are apart from each other at least at a given distance. This is true also in the case where the acid-decomposable dissolution inhibitive compound has two acid-decomposable groups.

The distance between acid-decomposable groups in the present invention is expressed in terms of the number of bonding atoms present between the groups, excluding the atoms contained in the groups. For example, in each of compounds (1) and (2) shown below, the distance between acid-decomposable groups is 4 bonding atoms. In compound (3), that distance is 12 bonding atoms.

(1)

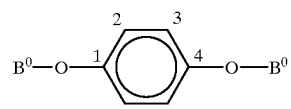

$$A^0-OOC-{}^1CH_2-{}^2CH_2-{}^3CH_2-{}^4CH_2-COO-A^0 \quad (2)$$

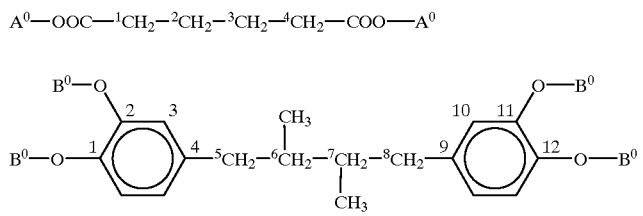

(3)

acid-decomposable group: —COO—A⁰, —O—B⁰

Although the acid-decomposable dissolution inhibitive compound for use in the present invention may have two or more acid-decomposable groups on the same benzene ring, it is preferably a compound having a framework in which each benzene ring does not have more than one acid-decomposable group. The molecular weight of the acid-decomposable dissolution inhibitive compound for use in the present invention is 3,000 or lower, preferably from 500 to 3,000, more preferably from 1,000 to 2,500.

In a preferred embodiment of the present invention, examples of groups containing an acid-decomposable group, i.e., —COO—A⁰ or —O—B⁰, include groups represented by —R⁰—COO—A⁰ or —Ar—O—B⁰.

In the above formulae, A⁰ represents —C(R⁰¹)(R⁰²)(R⁰³), —Si(R⁰¹)(R⁰²)(R⁰³), or —C(R⁰⁴)(R⁰⁵)—O—R⁰⁶, and B⁰ represents A⁰ or —CO—O—A⁰.

R⁰¹, R⁰², R⁰³, R⁰⁴, and R⁰⁵ may be the same or different and each represents a hydrogen atom, an alkyl group, a cycloalkyl group, an alkenyl group, or an aryl group, and R⁰⁶ represents an alkyl group or an aryl group, provided that at least two of R⁰¹ to R⁰³ are not hydrogen atoms, and that two of R⁰¹ to R⁰³ or two of R⁰⁴ to R⁰⁶ may be bonded to each other to form a ring. R⁰ represents an optionally substituted, aliphatic or aromatic hydrocarbon group having a valence of 2 or higher, and —Ar— represents an optionally substituted, mono- or polycyclic aromatic group having a valence of 2 or higher.

The alkyl group is preferably one having 1 to 4 carbon atoms, such as methyl, ethyl, propyl, n-butyl, sec-butyl, or t-butyl. The cycloalkyl group is preferably one having 3 to 10 carbon atoms, such as cyclopropyl, cyclobutyl, cyclohexyl, or adamantyl. The alkenyl group is preferably one having 2 to 4 carbon atoms, such as vinyl, propenyl, allyl, or butenyl. The aryl group is preferably one having 6 to 14 carbon atoms, such as phenyl, xylyl, toluyl, cumenyl, naphthyl, or anthracenyl.

Examples of the substituents include hydroxy, halogen atoms (fluorine, chlorine, bromine, and iodine), nitro, cyano, the alkyl groups enumerated above, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the alkenyl groups enumerated above, alkenyloxy groups such as vinyloxy, propenyloxy, allyloxy, and butenyloxy, the aryl groups enumerated above, aryloxy groups such as phenoxy, and aryloxycarbonyl groups such as benzoyloxy.

Desirable examples of the acid-decomposable groups include silyl ether groups, cumyl ester groups, acetal groups, tetrahydropyranyl ether groups, enol ether groups, enol ester groups, tertiary alkyl ether groups, tertiary alkyl ester groups, and tertiary alkyl carbonate groups. Preferred of these are tertiary alkyl ester groups, tertiary alkyl carbonate groups, cumyl ester groups, and tetrahydropyranyl ether groups.

Desirable acid-decomposable dissolution inhibitive compounds include compounds obtained from the polyhydroxy compounds given in the patent documents specified below by protecting part or all of the phenolic OH groups by bonding thereto protective groups shown above, i.e., groups represented by —R⁰—COO—A⁰ or B⁰; the patent documents include JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Applications Nos. 3-33229, 3-230790, 3-320438, 4-25157, 4-52732, 4-103215, 4-104542, 4-107885, 4-107889, and 4-152195.

Preferred of these are the compounds obtained from the polyhydroxy compounds given in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Applications Nos. 4-25157, 4-103215, 4-104542, 4-107885, 4-107889, and 4-152195.

Specifically, such acid-decomposable dissolution inhibitive compounds are represented by general formulae [I] to [XVI].

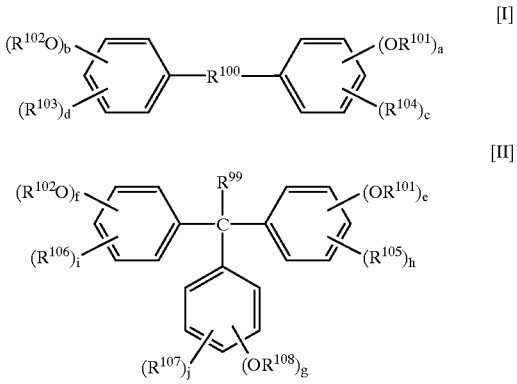

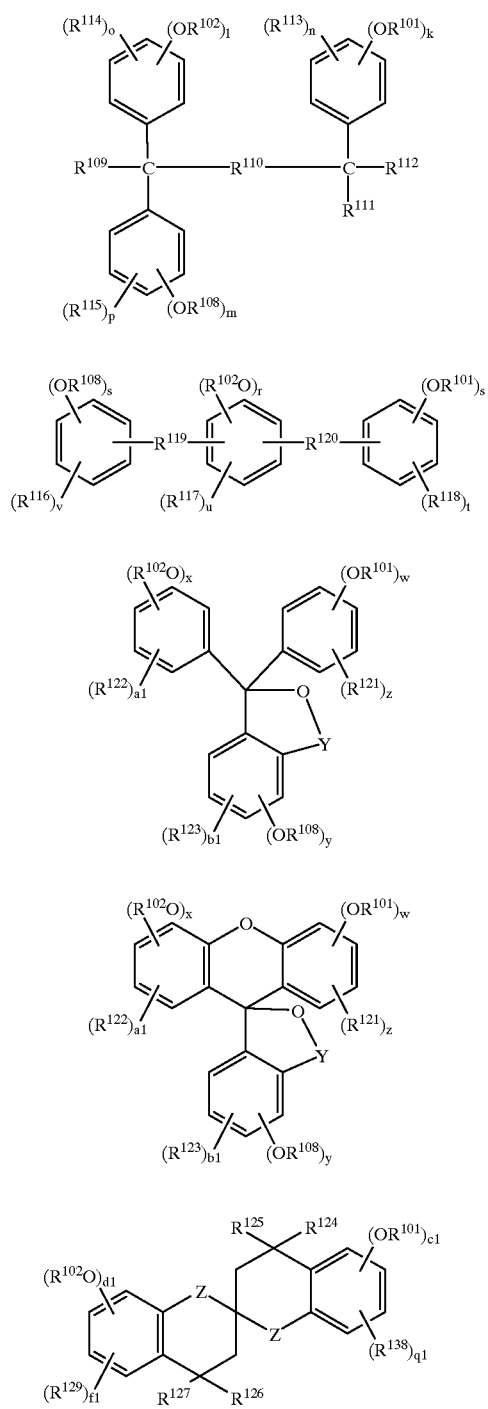
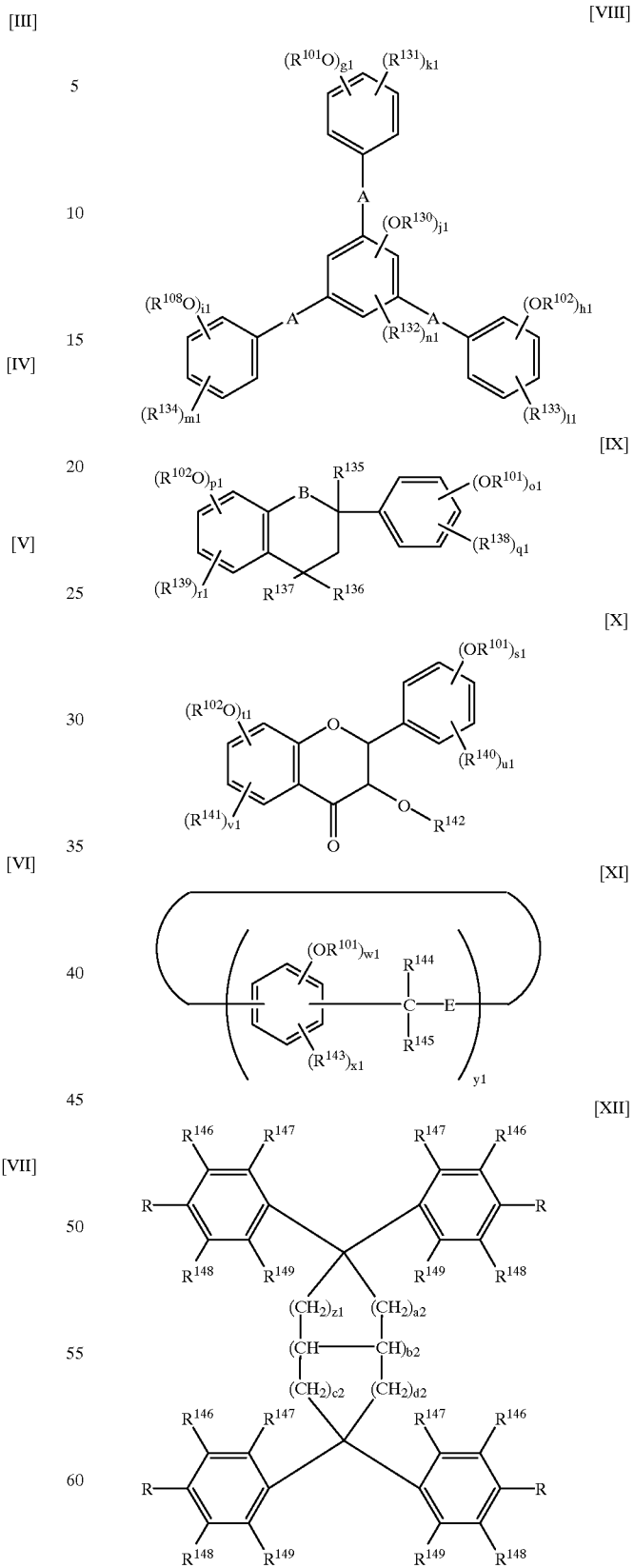

In the above formulae, $R^{101}$, $R^{102}$, $R^{108}$, and $R^{130}$ may be the same or different and each represents a hydrogen atom, $-R^0-COO-C(R^{01})(R^{02})(R^{03})$, or $-CO-O-C(R^{01})(R^{02})(R^{03})$, wherein $R^0$, $R^{01}$, $R^{02}$, and $R^{03}$ have the same meanings as defined hereinabove;

$R^{100}$ represents $-CO-$, $-COO-$, $-NHCONH-$, $-NHCOO-$, $-O-$, $-S-$, $-SO-$, $-SO_2-$, $-SO_3-$, or a group represented by

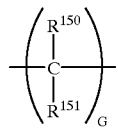

where
G is 2 to 6, provided that when G is 2, at least either of $R^{150}$ and $R^{151}$ is an alkyl group, $R^{150}$ and $R^{151}$ may be the same or different and each represents a hydrogen atom, an alkyl group, an alkoxy group, $-OH$, $-COOH$, $-CN$, a halogen atom, $-R^{152}-COOR^{153}$, or $-R^{154}-OH$, $R^{152}$ and $R^{154}$ each represents an alkylene group, and $R^{153}$ represents a hydrogen atom, an alkyl group, an aryl group, or an aralkyl group;

$R^{99}$, $R^{103}$ to $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or $-N(R^{155})(R^{156})$ (where $R^{155}$ and $R^{156}$ each represents H, an alkyl group, or an aryl group);

$R^{110}$ represents a single bond, an alkylene group, or a group represented by

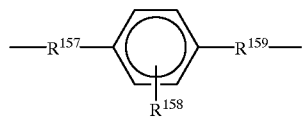

where
$R^{157}$ and $R^{159}$ may be the same or different and each represents a single bond, an alkylene group, $-O-$, $-S-$, $-CO-$, or a carboxyl group, and $R^{158}$ represents a hydrogen atom, an alkyl group, an alkoxy group, an acyl group, an acyloxy group, an aryl group, a nitro group, a hydroxyl group, a cyano group, or a carboxyl group, provided that each hydroxyl group may be replaced by an acid-decomposable group (e.g., t-butoxycarbonylmethyl, tetrahydropyranyl, 1-ethoxy-1-ethyl, or 1-t-butoxy-1-ethyl);

$R^{119}$ and $R^{120}$ may be the same or different and each represents a methylene group, a lower-alkyl-substituted methylene group, a halomethylene group, or a haloalkyl group, provided that the term "lower alkyl" herein means an alkyl group having 1 to 4 carbon atoms;

$R^{124}$ to $R^{127}$ may be the same or different and each represents a hydrogen atom or an alkyl group;

$R^{135}$ to $R^{137}$ may be the same or different and each represents a hydrogen atom, an alkyl group, an alkoxy group, an acyl group, or an acyloxy group;

$R^{142}$ represents a hydrogen atom, $-R^0-COO-C(R^{01})(R^{02})(R^{03})$, $-CO-O-C(R^{01})(R^{02})(R^{03})$, or the group represented by

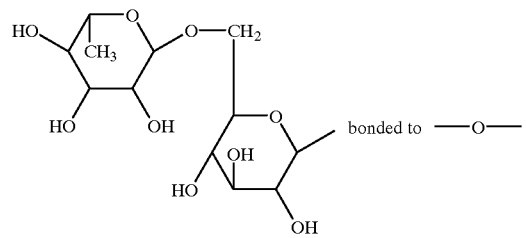

$R^{144}$ and $R^{145}$ may be the same or different and each represents a hydrogen atom, a lower alkyl group, a lower haloalkyl group, or an aryl group;

$R^{146}$ to $R^{149}$ may be the same or different and each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four groups represented by the same symbol need not be the same;

Y represents $-CO-$ or $-SO_2-$;

Z and B each represents a single bond or $-O-$;

A represents a methylene group, a lower-alkyl-substituted methylene group, a halomethylene group, or a haloalkyl group;

E represents a single bond or an oxymethylene group;

when any of a to z and a1 to y1 is 2 or a larger integer, the groups in the parentheses may be the same or different;

a to q, s, t, v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1to 4;

j1, n1, z1, a2, b2, c2, and d2 each represents 0 or an integer of 1 to 3;

at least one of z1, a2, c2, and d2 is 1 or larger;

y1 is an integer of 3 to 8;

(a+b), (e+f+g), (k+l+m), (q+r+s), (w+x+y), (c1+d1), (g1+h1+i1+j1), (o1+p1), and (s1+t1) each is 2 or larger;

(j1+n1) is 3 or smaller;

(r+u), (w+z), (x+a1), (y+b1), (c1+e1), (d1+f1), (p1+r1), (t1+v1), and (x1+w1) each is 4 or smaller, provided that in general formula [V], (w+z) and (x+a1) each is 5 or smaller; and (a+c), (b+d), (e+h), (f+i), (g+j), (k+n), (l+o), (m+p), (q+t), (s+v), (g1+k1), (h1+l1), (i1+m1), (o1+q1), and (s1+u1) each is 5 or smaller.

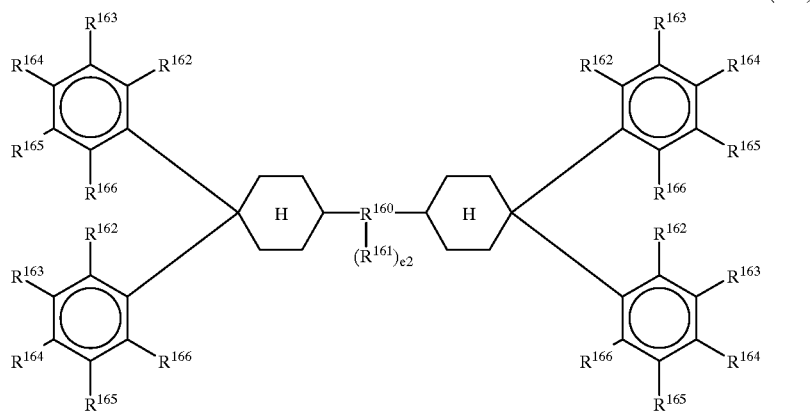

(XIII)

In formula (XIII), $R^{160}$ represents an organic group, a single bond, —S—, —SO—, or

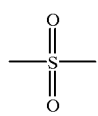

$R^{161}$ represents a hydrogen atom, a monovalent organic group, or a group represented by

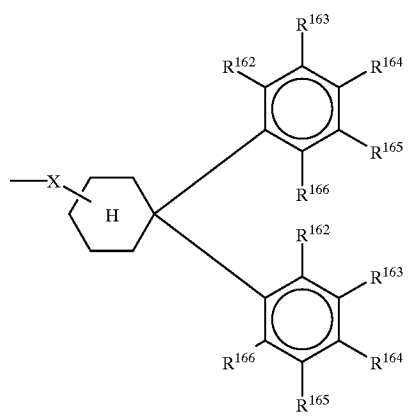

where
$R^{162}$ to $R^{166}$ may be the same or different and each represents a hydrogen atom, a hydroxyl group, a halogen atom, an alkyl group, an alkoxy group, an alkenyl group, —O—$R^0$—COO—C($R^{01}$)($R^{02}$)($R^{03}$), or —O—CO—O—C($R^{01}$)($R^{02}$)($R^{03}$), provided that at least two of $R^{162}$ to $R^{166}$ are —O—$R^0$—COO—C($R^{01}$)($R^{02}$)($R^{03}$) or —O—CO—O—C($R^{01}$)($R^{02}$)($R^{03}$), and that the four or six substituents represented by the same symbol need not be the same, and X represents a divalent organic group; and e2 represents 0 or 1.

(XIV)

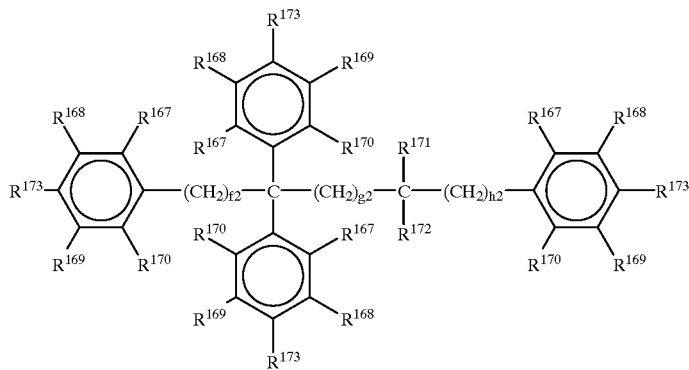

In formula (XIV), $R^{167}$ to $R^{170}$ may be the same or different and each represents a hydrogen atom, a hydroxyl group, a halogen atom, an alkyl group, an alkoxy group, or an alkenyl group, provided that the four to six substituents represented by the same symbol need not be the same;

$R^{171}$ and $R^{172}$ each represents a hydrogen atom an alkyl group, or a group represented by

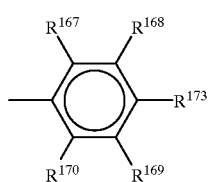

at least two of $R^{173}$'s each represents —O—$R^0$—COO—C($R^{01}$) ($R^{02}$) ($R^{03}$) or —O—CO—O—C($R^{01}$) ($R^{02}$) ($R^{03}$) and the remainder each represents a hydroxyl group;

f2 and h2 each represents 0 or 1; and g2 represents 0 or an integer of 1 to 4.

(XV)

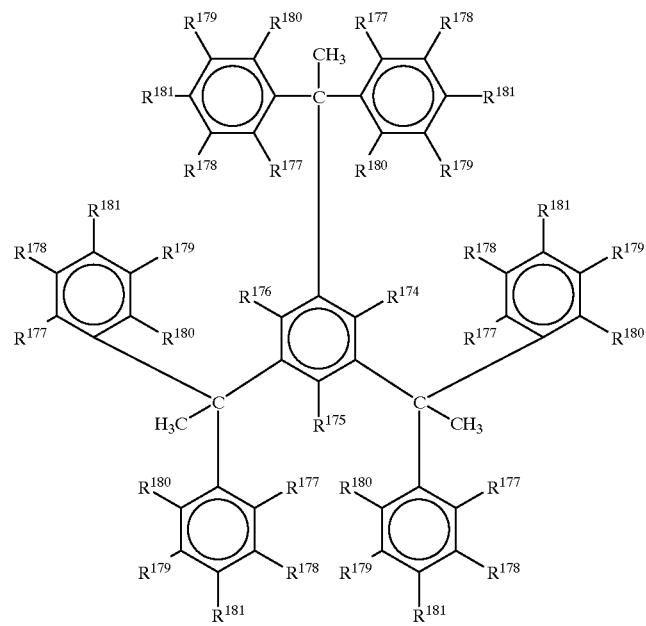

In formula (XV), $R^{174}$ to $R^{180}$ may be the same or different and each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group, or an aryloxy group, provided that the six substituents represented by the same symbol need not be the same; and at least two of $R^{181}$'s each represents —O—$R^0$—COO—C($R^{01}$) ($R^{02}$) ($R^{03}$) or —O—CO—O—C($R^{01}$) ($R^{02}$) ($R^{03}$), and the remainder each represents a hydroxyl group.

(XVI)

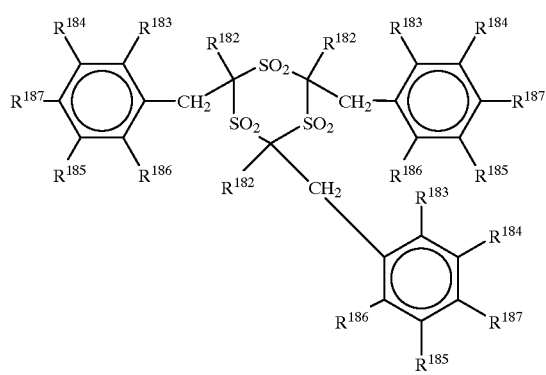

In formula (XVI), $R^{182}$ represents a hydrogen atom or an alkyl group, provided that the atoms or groups represented by $R^{182}$ need not be the same;

$R^{183}$ to $R^{186}$ each represents a hydroxyl group, a hydrogen atom, a halogen atom, an alkyl group, or an alkoxy group, provided that the three substituents represented by the same symbol need not be the same; and at least two of $R^{187}$'s each represents —O—$R^0$—COO—C($R^{01}$) ($R^{02}$) ($R^{03}$) or —O—CO—O—C($R^{01}$) ($R^{02}$) ($R^{03}$), and the remainder each represents a hydroxyl group.

Specific examples of the frameworks of preferred compounds are shown below.

(1)
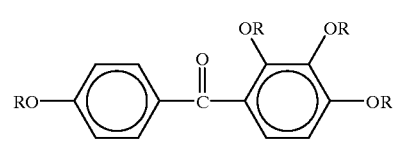

(2)
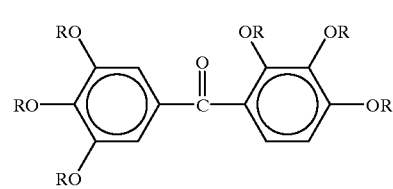

(3)
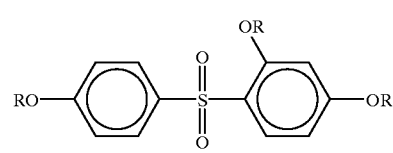

(4)
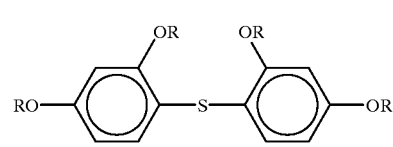

(5)
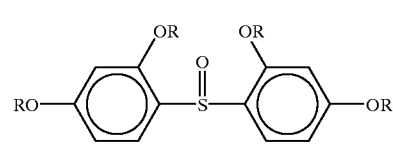

(6)
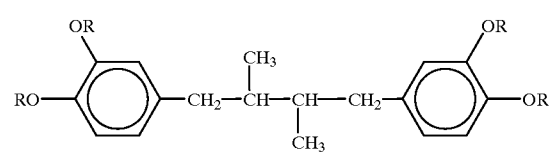

(7)
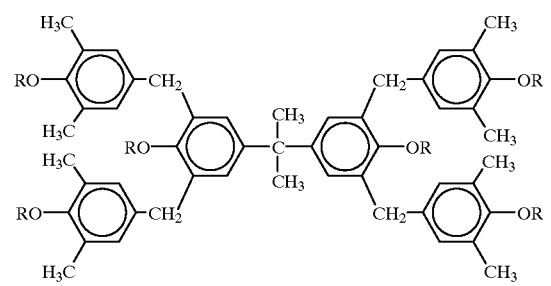

(8)
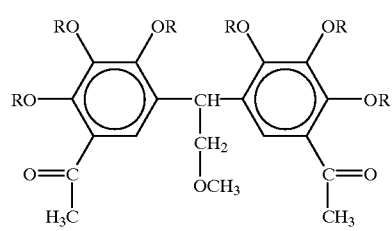

(9)
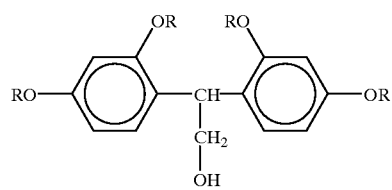

(10)
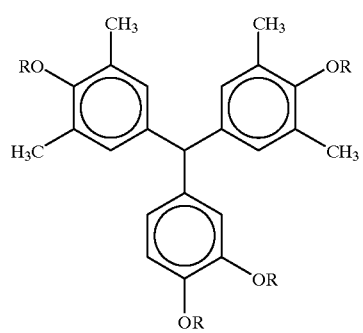

(11)
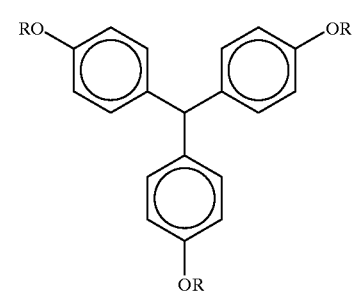

(12) 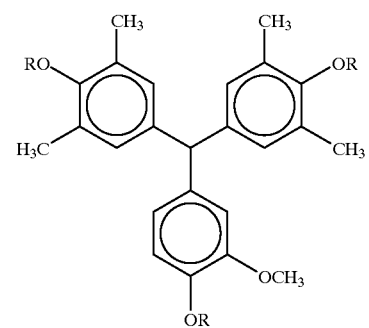
(13) 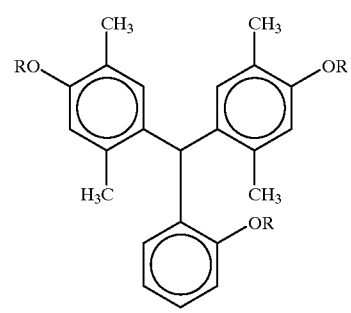
(14) 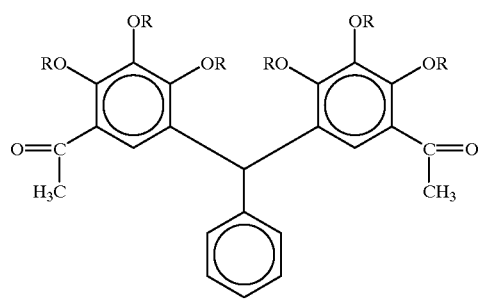
(15) 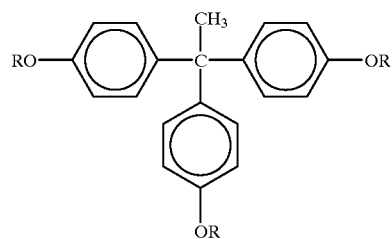
(16) 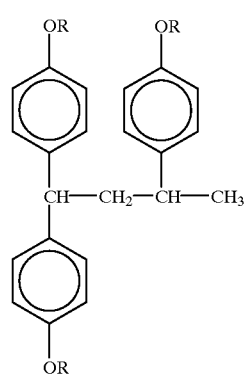
(17) 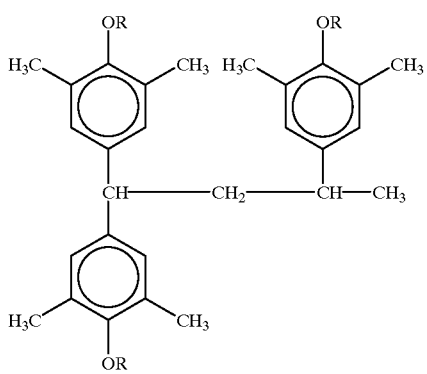
(18) 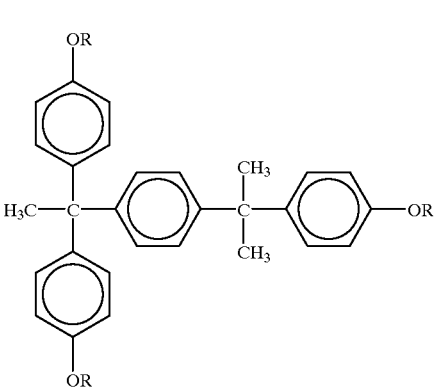
(19) 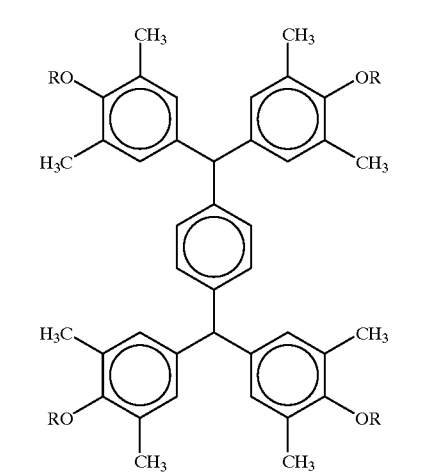

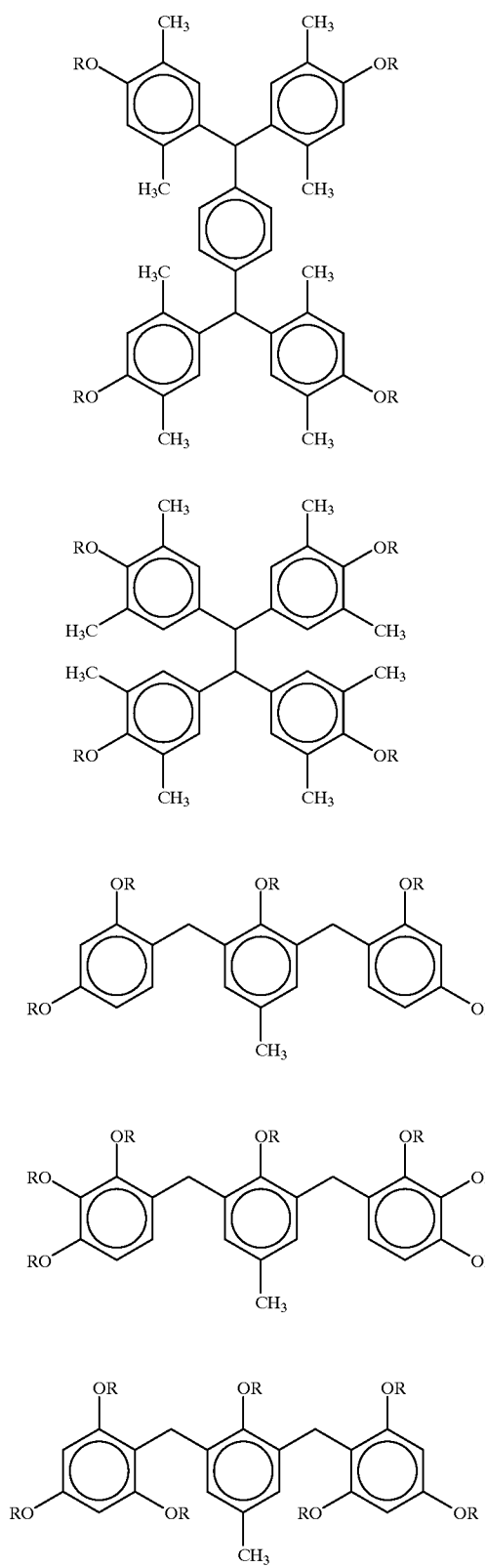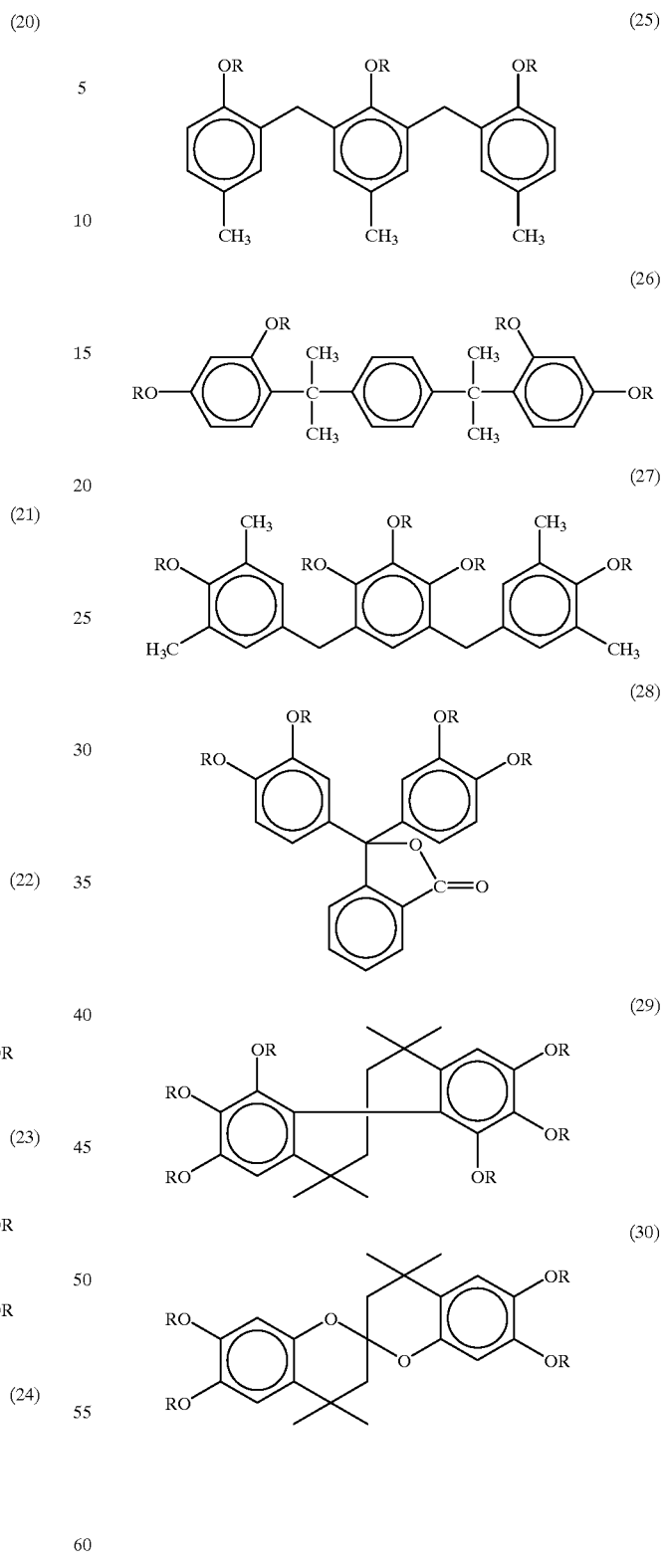

-continued
(31)
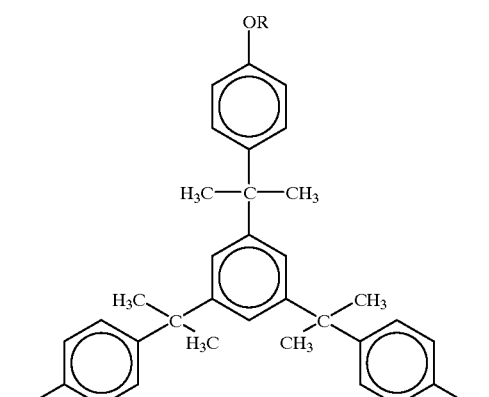
(32)
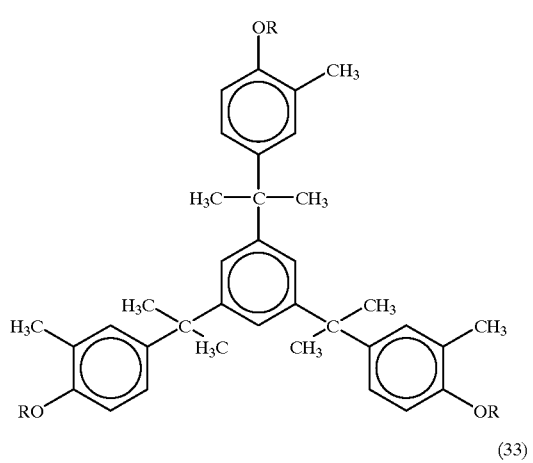
(33)
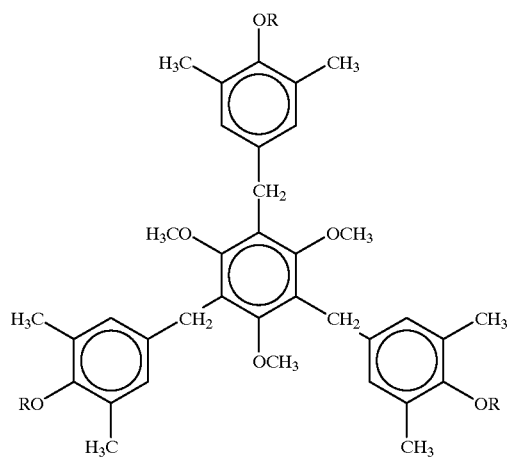
-continued
(34)
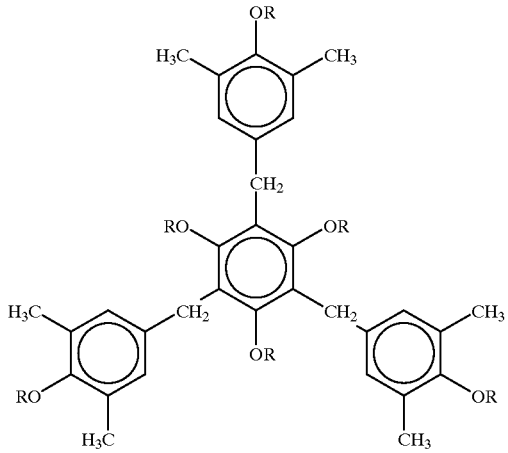
(35)
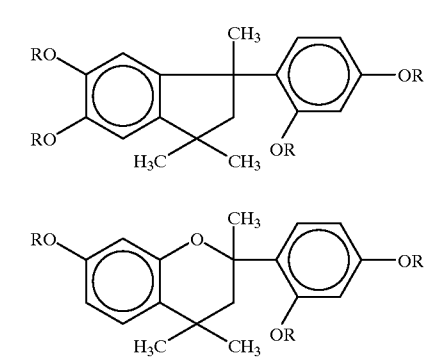
(36)
(37)
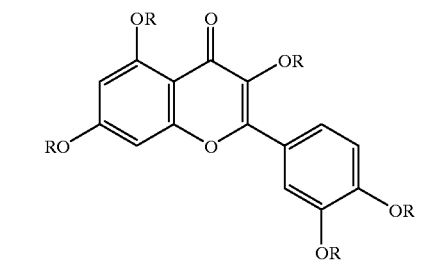
(38)
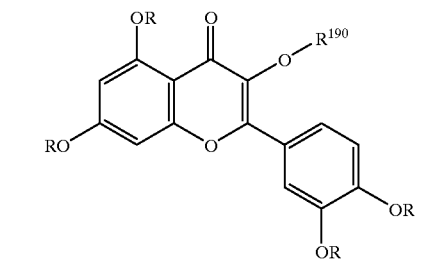
$R^{190}$:
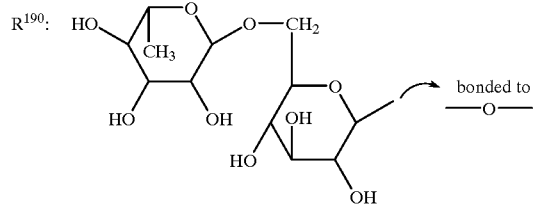

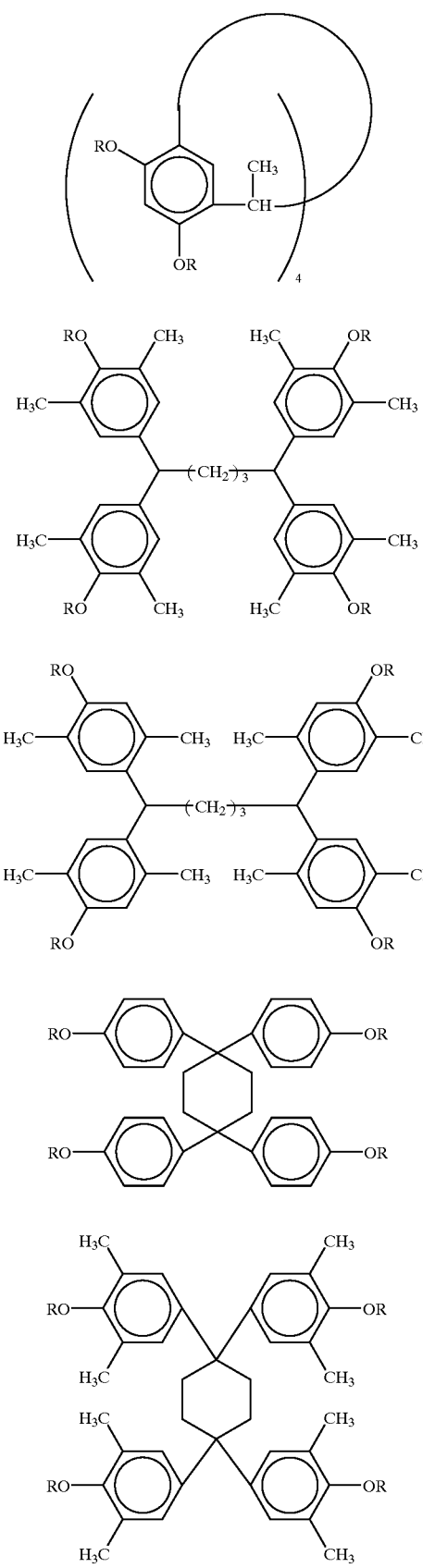
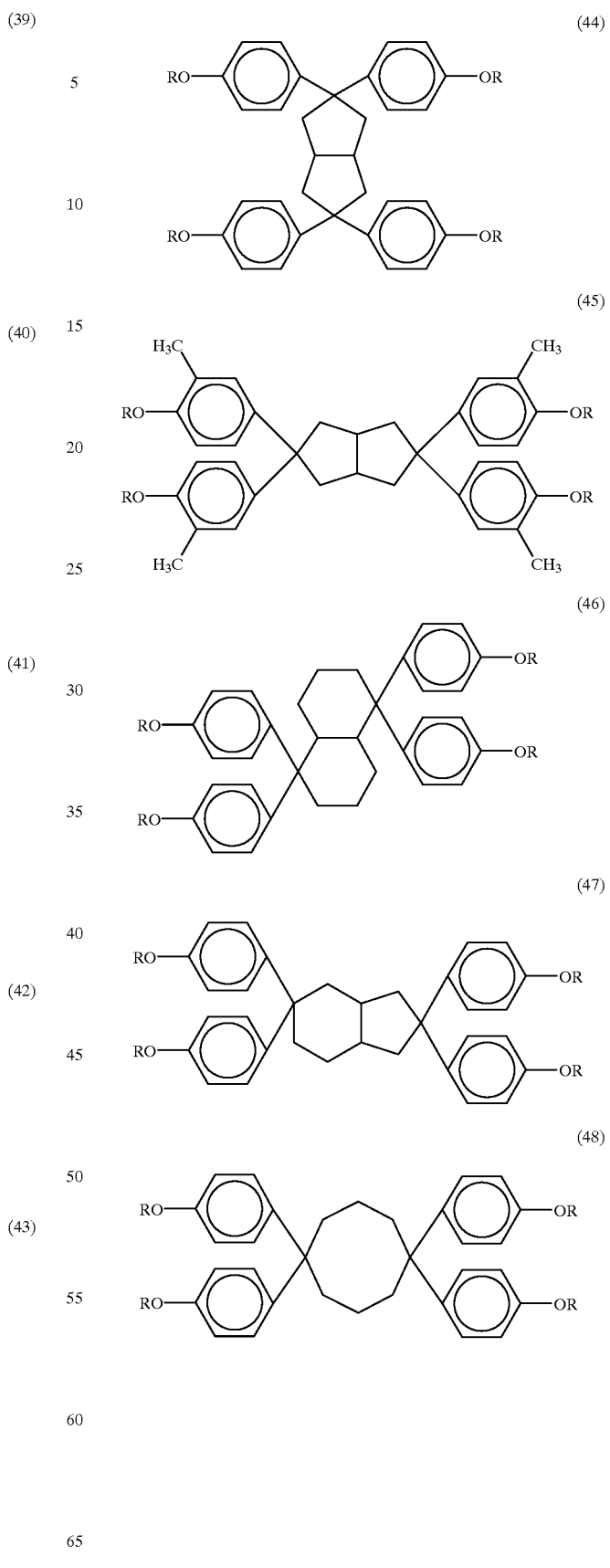

(49)
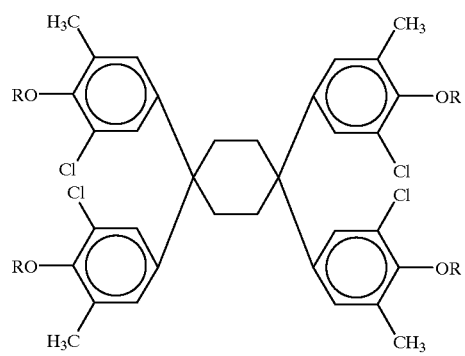
(50)
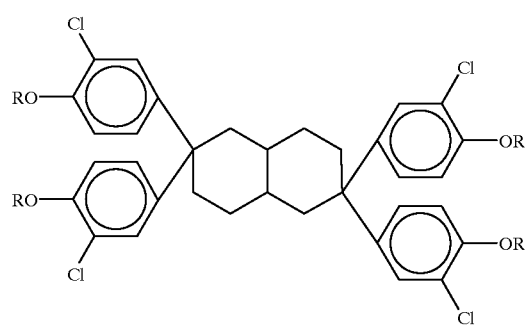
(51)
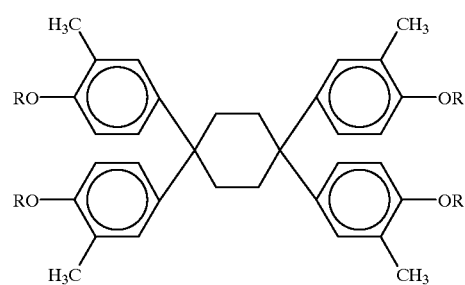
(52)
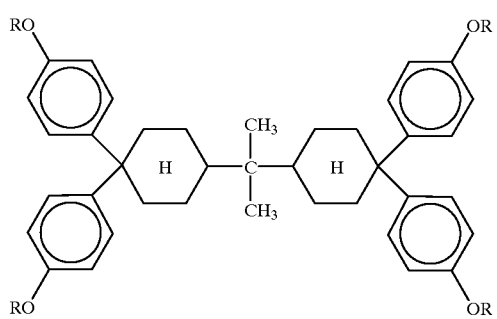
(53)
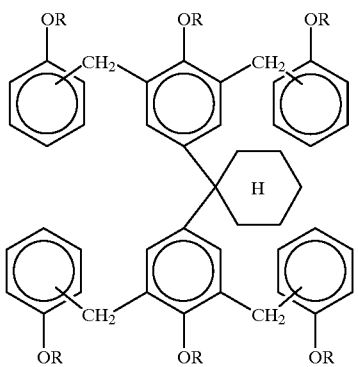
(54)
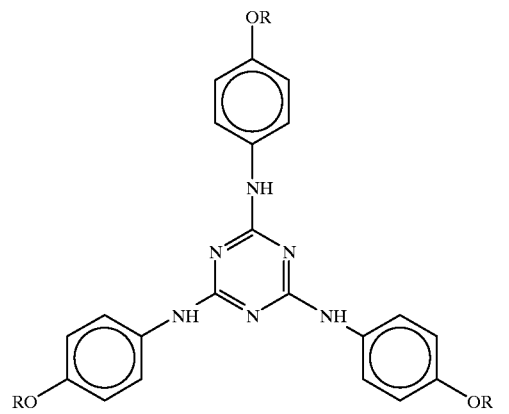
(55)
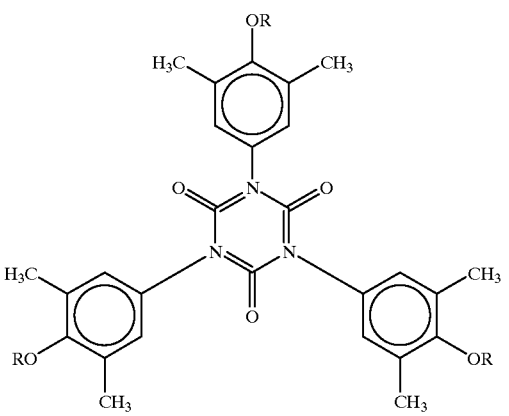

(56)
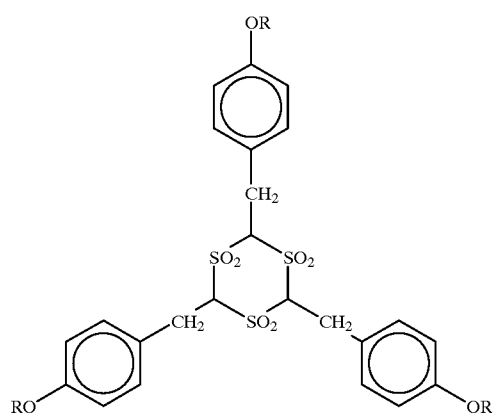
(57)
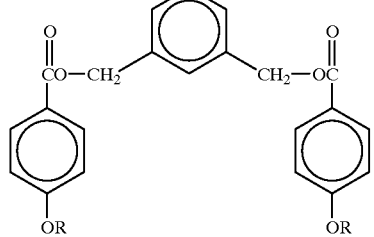
(58)
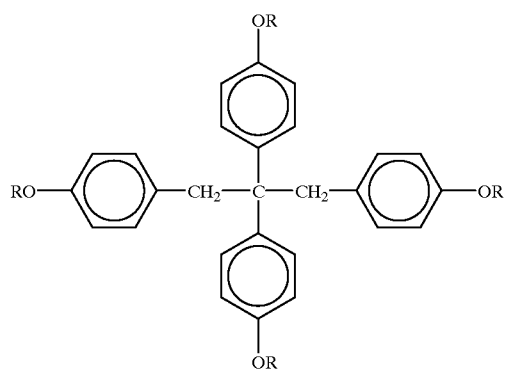
(59)
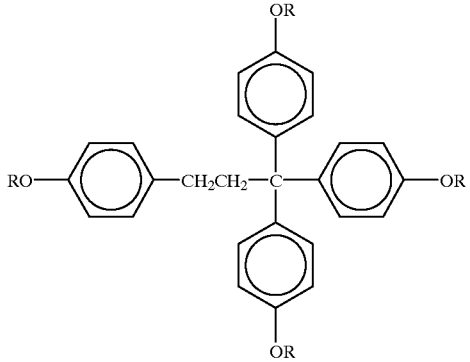
(60)
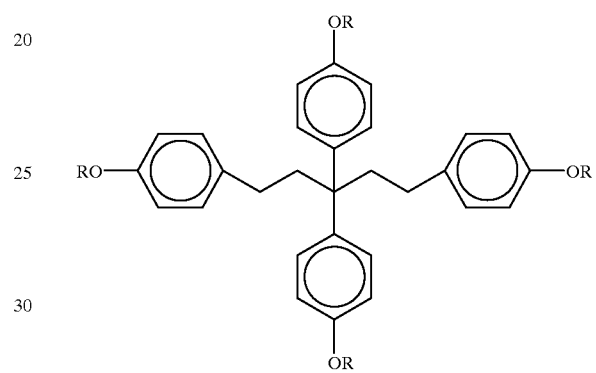
(61)
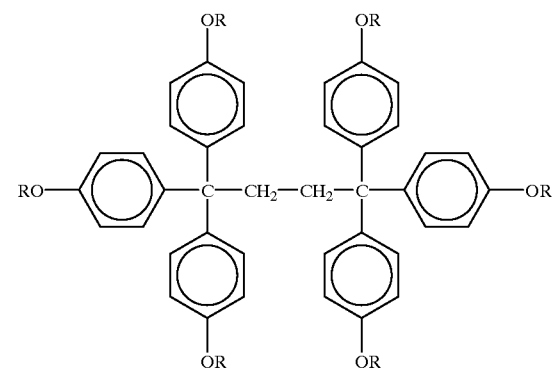
(62)
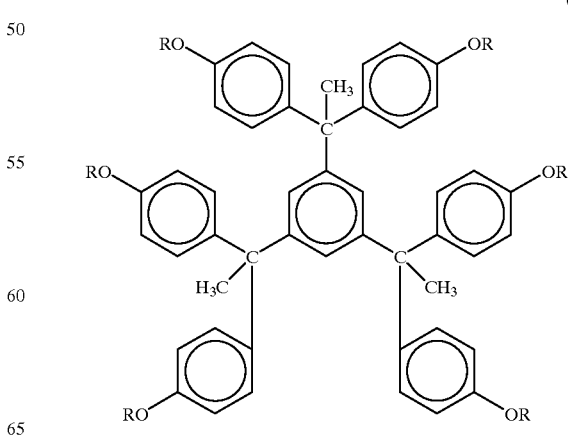

(63)

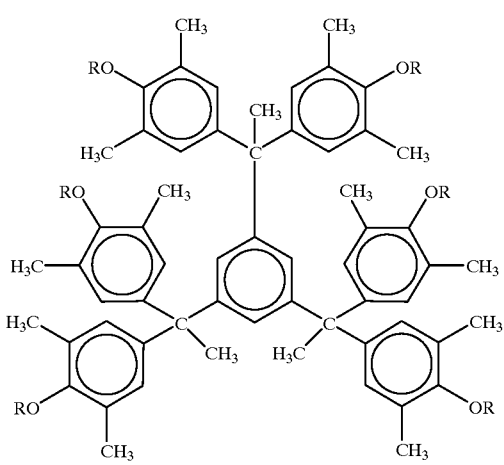

In Compounds (1) to (63), R represents a hydrogen atom, —CH₂—COO—C(CH₃)₂C₆H₅, —CH₂—COO—C₄H₉ᵗ, —COO—C₄H₉ᵗ, or the group represented by

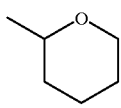

provided that at least two or, depending on the structure, at least three of R's are not hydrogen atoms, and that the substituents represented by R need not be the same.

In the case where the dissolution inhibitive compound described above is used in the present invention in combination with the acid generator compound and the alkali-soluble resin, the addition amount of the dissolution inhibitive compound is generally from 3 to 50% by weight, preferably from 5 to 40% by weight, more preferably from 10 to 35% by weight, based on the total amount of the photosensitive composition (exceeding the solvent).

[VI] Other Ingredients Usable in the Invention

The photosensitive composition of the present invention may optionally further contain other ingredients such as, e.g., dyes, pigments, plasticizers, surfactants, photosensitizers, organic basic compounds, and compounds having two or more phenolic OH groups capable of accelerating dissolution into a developing solution.

The compounds having two or more phenolic OH groups usable in the present invention are preferably phenolic compounds having a molecular weight of 1,000 or lower. These compounds each should have at least two phenolic hydroxyl groups per molecule. However, if the number of phenolic hydroxyl groups per molecule exceeds 10, the effect of improving development latitude is lost. If the ratio of the number of phenolic hydroxyl groups to the number of aromatic rings is lower than 0.5, too large a film thickness dependence and a narrowed development latitude tend to result. If it exceeds 1.4, the composition has impaired stability and it is difficult to obtain high resolution and a satisfactory film thickness dependence.

The addition amount of such a phenolic compound is preferably from 2 to 50% by weight, more preferably from 5 to 30% by weight, based on the amount of the alkali-soluble resin. If the added amount thereof exceeds 50% by weight, there is a possibility of causing deterioraion in terms of development residue or a new drawback that pattern deformation occurs during development.

Such phenolic compounds having a molecular weight of 1,000 or lower can be easily synthesized by persons skilled in the art by reference to the methods described in, e.g., JP-A-4-122938, JP-A-2-28531, U.S. Pat. No. 4,916,210, and European Patent 219,294.

Examples of the phenolic compounds are given below, but the phenolic compounds usable in the present invention should not be construed as being limited thereto.

The examples thereof include resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensation resins, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4-(α-methylbenzylidene)bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and α,α,α',α'-tetrakis(4-hydroxyphenyl)-p-xylene.

Desirable organic basic compounds usable in the present invention are compounds which are more strongly basic than phenol, in particular, nitrogen-containing basic compounds.

Preferred chemical environments include structures represented by the following formulae (A) to (E).

(A)

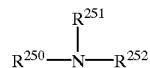

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

(B)

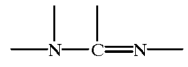

(C)

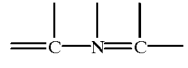

(D)

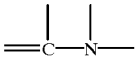

(E)

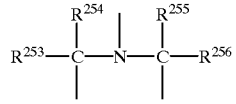

(In formula (E), $R^{253}$, $R^{254}$, $R^{255}$, and $R^{256}$ may be the same or different and each represents an alkyl group having 1 to 6 carbon atoms.)

Preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Examples of such preferred compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the effects of the present invention cannot be obtained. On the other hand, if it exceeds 10 parts by weight, reduced sensitivity and impaired developability at unexposed parts are liable to be caused.

Dyes suitable for use in the present invention are oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd., Japan), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to exhibit absorption in a region of longer wavelengths than far ultraviolet, whereby the photosensitive composition of the present invention can be rendered sensitive to an i- or g-line. Examples of spectral sensitizers suitable for use in the present invention include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

Those spectral sensitizers can be used also as light absorbers for absorbing the far ultraviolet emitted by a light source. In this case, the light absorber reduces light reflection from the substrate and lessens the influence of multiple reflection within the resist film, thereby producing the effect of diminishing standing wave marks.

For application to a substrate, the photosensitive composition of the present invention is used in the form of a solution in a solvent in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl- ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture thereof.

A surfactant can be added to the solvent. Examples of the surfactant include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company, Japan), Megafac F171 and F173 (manufactured by Dainippon Ink & Chemicals, Inc., Japan), Fluorad FC430 and FC431 (manufactured by Sumitomo 3M Ltd., Japan), Asahi Guard AG710 and Surflon S-382, SC101, SC102, SC103, SC104, SC105, and SC106 (manufactured by Asahi Glass Co., Ltd., Japan); organosiloxane polymer KP341 (manufactured by Shin-Etsu Chemical Co., Ltd., Japan); and acrylic or methacrylic (co)polymers Polyflow No. 75 and No. 95 (manufactured by Kyoeisha Chemical Co., Ltd., Japan). The added amount of the surfactant is usually 2 parts by weight or smaller, desirably 1 part by weight or smaller, per 100 parts by weight of the solid components of the composition of the present invention.

The surfactant may be added alone or in combination of two or more thereof.

A satisfactory resist pattern can be obtained by applying the photosensitive composition described above on a substrate such as those for use in the production of precision integrated-circuit elements (e.g., silicon/silicon dioxide coating) by an appropriate coating means, e.g., a spinner or coater, exposing the coating to light through a mask, and then baking and developing the coating.

As a developing solution for the photosensitive composition of the present invention, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the invention should not be construed as being limited thereto.

SYNTHESIS EXAMPLE 1

Into 200 ml of ion-exchanged water was dissolved 21.9 g (0.030 mol) of a 45% aqueous solution of the sulfonium chloride salt shown below. To this solution was added with stirring at room temperature a solution of 10.5 g (0.030 mol) of a hard (branched) sodium dodecylbenzenesulfonate having the following structure in 400 ml of ion-exchanged water.

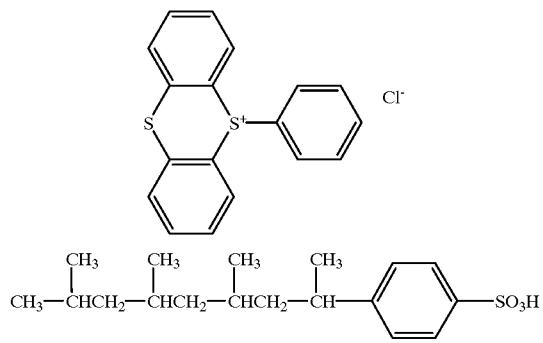

The resulting viscous solid precipitate was separated by decantation and then washed with 1 l of ion-exchanged water. The viscous solid obtained was dissolved into 100 ml of acetone, and this solution was poured into 500 ml of ion-exchanged water with stirring to recrystallize the solid. The precipitate was dried at 50° C. under vacuum. As a result, 16.0 g of a vitreous solid was obtained. It was confirmed by NMR spectrometry that this solid was Compound (Ia-4) according to the present invention.

SYNTHESIS EXAMPLE 2

The same procedure as in Synthesis Example 1 was conducted, except that 9.3 g (0.030 mol) of a branched sodium octyloxybenzenesulfonate was used in place of 10.5 g (0.030 mol) of the sodium dodecylbenzenesulfonate. Thus, 14.1 g of a vitreous solid was obtained. It was confirmed by NMR spectrometry that this solid was Compound (Ia-7) according to the present invention.

SYNTHESIS EXAMPLE 3

The same procedure as in Synthesis Example 1 was conducted, except that 25.7 g (0.030 mol) of a 40% aqueous solution of sodium dibutylnaphthalenesulfonate was used in place of 10.5 g (0.030 mol) of the sodium dodecylbenzenesulfonate. Thus, 16.1 g of a vitreous solid was obtained. It was confirmed by NMR spectrometry that this solid was Compound (Ia-16).

SYNTHESIS EXAMPLE 4

The same procedure as in Synthesis Example 1 was conducted, except that 12.7 g (0.030 mol) of a branched sodium 9,10-dibutoxynaphthalene-2-sulfonate was used in place of 10.5 g (0.030 mol) of the sodium dodecylbenzenesulfonate. Thus, 16.9 g of a vitreous solid was obtained. It was confirmed by NMR spectrometry that this solid was Compound (Ia-24) according to the present invention.

SYNTHESIS EXAMPLE 5

Into 200 ml of ion-exchanged water was dissolved 20.9 g (0.015 mol) of a 45% aqueous solution of 4,4'-bis(diphenylsulphonyl)diphenylsulfide chlorude salt. To this solution was added with stirring at room temperature a solution of 10.5 g (0.030 mol) of a hard (branched) sodium dodecylbenzenesulfonate having the following structure in 400 ml of ion-exchanged water.

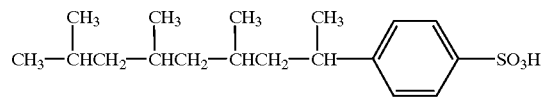

The resulting viscous solid precipitate was separated by decantation and then washed with 1 l of ion-exchanged water. The viscous solid obtained was dissolved into 100 ml of acetone, and this solution was poured into 500 ml of ion-exchanged water with stirring to recrystallize the solid. The precipitate was dried at 50° C. under vacuum. As a result, 15.9 g of a vitreous solid was obtained. It was confirmed by NMR spectrometry that this solid was Compound (Ib-4) according to the present invention.

SYNTHESIS EXAMPLE 6

The same procedure as in Synthesis Example 5 was conducted, except that 9.3 g (0.030 mol) of a branched sodium octyloxybenzenesulfonate was used in place of 10.5 g (0.030 mol) of the sodium dodecylbenzenesulfonate. Thus, 13.6 g of a vitreous solid was obtained. It was confirmed by NMR spectrometry that this solid was Compound (Ib-8) according to the present invention.

SYNTHESIS EXAMPLE 7

The same procedure as in Synthesis Example 5 was conducted, except that 25.7 g (0.030 mol) of a 40% aqueous solution of sodium dibutylnaphthalenesulfonate was used in place of 10.5 g (0.030 mol) of the sodium dodecylbenzenesulfonate. Thus, 15.2 g of a vitreous solid was obtained. It was confirmed by NMR spectrometry that this solid was Compound (Ib-15).

Other sulfonium compounds according to the present invention were synthesized in the same manner.

DISSOLUTION INHIBITIVE COMPOUND, SYNTHESIS EXAMPLE 1

Into 400 ml of tetrahydrofuran was dissolved 20 g of α,α',α"-tris(4-hydroxyphenyl)-1,3,5-triisopropylbenzene. To this solution was added 14 g of potassium tert-butoxide in a nitrogen atmosphere. After this mixture was stirred at room temperature for 10 minutes, 29.2 g of di-tert-butyl dicarbonate was added. The reaction mixture was allowed to react at room temperature for 3 hours and then poured into ice water. The reaction product was extracted with ethyl acetate, and the ethyl acetate layer was washed with water and dried. The solvent was then distilled off. The crystalline solid thus obtained was recrystallized (from diethyl ether) and dried to obtain 25.6 g of Dissolution Inhibitive Compound (31) (each R is a t-BOC group).

DISSOLUTION INHIBITIVE COMPOUND, SYNTHESIS EXAMPLE 2

Into 400 ml of diethyl ether was dissolved 20 g of α,α',α"-tris(4-hydroxyphenyl)-1,3,5-triisopropylbenzene. To this solution were added 31.6 g of 3,4-dihydro-2H-pyran and a catalytic amount of hydrochloric acid in a nitrogen atmosphere. The reaction mixture was allowed to react for 24 hours with refluxing. After completion of the reaction, a small amount of sodium hydroxide was added to the reaction mixture, which was then filtered. The solvent contained in the filtrate was distilled off, and the reaction product obtained was purified by column chromatography and dried to obtain Dissolution Inhibitive Compound (31) (each R is a THP group).

DISSOLUTION INHIBITIVE COMPOUND, SYNTHESIS EXAMPLE 3

To a solution of 19.2 g (0.040 mol) of α,α',α"-tris(4-hydroxyphenyl)-1,3,5-triisopropylbenzene in 120 ml of N,N-dimethylacetamide were added 21.2 g (0.15 mol) of potassium carbonate and 27.1 g (0.14 mol) of t-butyl bromoacetate. The reaction mixture was stirred at 120° C. for 7 hours, subsequently poured into 1.5 l of water, and then extracted with ethyl acetate. The extractant containing the reaction product was dried with magnesium sulfate and then concentrated. The residual reaction product was purified by column chromatography (carrier, silica gel; developing solvent, ethyl acetate/n-hexane=3/7 (by volume)). As a result, 30 g of a pale yellow viscous solid was obtained. It was confirmed by NMR spectrometry that this solid was Dissolution Inhibitive Compound (31) (each R is a —$CH_2COOC_4H_9^t$ group).

DISSOLUTION INHIBITIVE COMPOUND, SYNTHESIS EXAMPLE 4

Into 300 ml of N,N-dimethylacetamide was dissolved 42.4 g (0.10 mol) of 1-[α-methyl-α-(4'-hydroxyphenyl)ethyl]-4-[α',α'-bis(4"-hydroxyphenyl)ethyl]benzene. Thereto were added 49.5 g (0.35 mol) of potassium carbonate and 84.8 g (0.33 mol) of cumyl bromoacetate. The resulting reaction mixture was stirred at 120° C. for 7 hours and then poured into 2 l of ion-exchanged water. This mixture was neutralized with acetic acid and extracted with ethyl acetate. The ethyl acetate extractant containing the reaction product was concentrated, and the residual reaction product was purified in the same manner as in Synthesis Example 3. Thus, 70 g of Dissolution Inhibitive Compound (18) (each R is a —$CH_2COOC(CH_3)_2C_6H_5$ group) was obtained.

DISSOLUTION INHIBITIVE COMPOUND, SYNTHESIS EXAMPLE 5

To a solution of 14.3 g (0.020 mol) of α,α,α',α',α",α"-hexakis(4-hydroxyphenyl)-1,3,5-triethylbenzene in 120 ml of N,N-dimethylacetamide were added 21.2 g (0.15 mol) of potassium carbonate and 27.1 g (0.14 mol) of t-butyl bromoacetate. The reaction mixture was stirred at 120° C. for 7 hours, subsequently poured into 1.5 l of water, and then extracted with ethyl acetate. The extractant containing the reaction product was dried with magnesium sulfate and then concentrated. The residual reaction product was purified by column chromatography (carrier, silica gel; developing solvent, ethyl acetate/n-hexane=2/8 (by volume)). As a result, 24 g of a pale yellow powder was obtained. It was confirmed by NMR spectrometry that this powder was Dissolution Inhibitive Compound (62) (each R is a —$CH_2$—COO—$C_4H_9^t$ group).

DISSOLUTION INHIBITIVE COMPOUND, SYNTHESIS EXAMPLE 6

Into 400 ml of tetrahydrofuran (THF) was dissolved 20 g (0.042 mol) of α,α',α"-tris(4-hydroxyphenyl)-1,3,5-triisopropylbenzene. To this solution was added 9.3 g (0.083 mol) of potassium t-butoxide in a nitrogen atmosphere. After this mixture was stirred at room temperature for 10 minutes, 19.5 g (0.087 mol) of di-t-butyl dicarbonate was added. The reaction mixture was allowed to react at room temperature for 3 hours and then poured into ice water. The reaction product was extracted with ethyl acetate.

The ethyl acetate extractant containing the reaction product was concentrated, and the residual reaction product was separated and purified by column chromatography (carrier, silica gel; developing solvent, ethyl acetate/n-hexane=1/5 (by volume)). As a result, 7 g of Dissolution Inhibitive Compound (31) (two R's each is a t-BOC group and one is a hydrogen atom) was obtained.

DISSOLUTION INHIBITIVE COMPOUND, SYNTHESIS EXAMPLE 7

Into 300 ml of dimethylacetamide was dissolved 48.1 g (0.10 mol) of α,α',α"-tris(4-hydroxyphenyl)-1,3,5-triisopropylbenzene. Thereto were added 22.1 g (0.16 mol) of potassium carbonate and 42.9 g (0.22 mol) of t-butyl bromoacetate. The reaction mixture was stirred at 120° C. for 5 hours and then poured into 2 l of ion-exchanged water. This mixture was neutralized with acetic acid and extracted with ethyl acetate.

The ethyl acetate extractant containing the reaction product was concentrated, and the residual reaction product was separated and purified by column chromatography (carrier, silica gel; developing solvent, ethyl acetate/n-hexane=1/5 (by volume)). As a result, 10 g of Dissolution Inhibitive Compound (31) (two R's each is a —$CH_2$—COO—$C_4H_9^t$ group and one is a hydrogen atom) was obtained.

EXAMPLE 1

The compounds according to the present invention which had been obtained by the methods shown in the Synthesis Examples given above were examined for solubility in the solvents specified below. The results obtained are shown in Table 1 together with the results obtained with comparative compounds.

In the solubility test, 0.2 g of each compound according to the present invention was added to 10 ml of a solvent and the degree of dissolution was visually evaluated.

TABLE 1

Solubility in Solvents

| Compound No. | Solvent Used | | |
|---|---|---|---|
| | Acetone | PGMEA | EL/EEP (7/3) |
| Ia-4 | A | A | A |
| Ia-7 | A | A | A |
| Ia-12 | A | A | A |
| Ia-14 | A | A | A |
| Ia-17 | A | A | A |
| Ia-20 | A | A | A |
| Ia-24 | A | A | A |
| Ia-28 | A | A | A |
| Ib-1 | A | A | A |
| Ib-3 | A | A | A |
| Ib-4 | A | A | A |
| Ib-5 | A | A | A |
| Ib-10 | A | A | A |
| Ib-13 | A | A | A |
| Ib-15 | A | A | A |
| Ib-22 | A | A | A |
| Ib-26 | A | A | A |
| Comparative Compound (A) | B | C | C |
| Comparative Compound (B) | B | C | C |

Symbols in the Table

A: dissolved

B: partly dissolved

C: undissolved

Solvents Used

PGMEA: propylene glycol monomethyl ether acetate

EL: ethyl lactate

EEP: ethyl 3-ethoxypropionate

Comparative Compounds (A): triphenylsulfonium p-toluenesulfonate (B): diphenyliodonium p-toluenesulfonate The results given in Table 1 show that the photo-acid generators according to the present invention had excellent solubility in the solvents.

EXAMPLES 2 TO 21 AND COMPARATIVE EXAMPLES 1 TO 4

Resists were prepared using the compounds according to the present invention which were shown in the Synthesis Examples given above. The formulations used are shown in Table 2.

TABLE 2

Formulations for Photosensitive Compositions

| | Photo-acid Generater (g) | Resin (g) | Additive (Dissolution Inhibitive Compound, Alkali-Soluble Resin) | Acid-Decomposable Group |
|---|---|---|---|---|
| Example 2 | Compound (Ia-4) 0.10 g | PHS/EES 1.90 g | — | — |
| Example 3 | Compound (Ia-10) 0.10 g | PHS/EES 1.90 g | — | — |
| Example 4 | Compound (Ia-7) 0.10 g | PHS/THPS 1.90 g | — | — |
| Example 5 | Compound (Ia-12) 0.10 g | PHS/BES 1.90 g | — | — |
| Example 6 | Compound (Ia-14) 0.10 g | PHS/TBOMS 1.60 g | Dissolution Inhibitive Compound (7) 0.30 g | EE |
| Example 7 | Compound (Ia-17) 0.10 g | PHS/THPS 1.60 g | Dissolution Inhibitive Compound (16) 0.30 g | TBE |
| Example 8 | Compound (Ia-22) 0.10 g | PHS/EES 1.60 g | Dissolution Inhibitive Compound (31) 0.30 g | TBOC |
| Example 9 | Compound (Ia-24) 0.10 g | PHS/TBOMS 1.60 g | Dissolution Inhibitive Compound (18) 0.30 g | THP |
| Example 10 | Compound (Ia-4) 0.10 g | PHS/THPS 1.20 g | Dissolution Inhibitive Compound (18) 0.30 g PHS/AcST 0.40 G | THP |
| Example 11 | Compound (Ia-28) 0.10 g | — | Dissolution Inhibitive Compound (62) 0.50 g PHS/St 1.40 g | THP |
| Example 12 | Compound (Ia-24) 0.10 g | — | Dissolution Inhibitive Compound (60) 0.50 g | EE |

TABLE 2-continued

Formulations for Photosensitive Compositions

| | Photo-acid Generater (g) | Resin (g) | Additive (Dissolution Inhibitive Compound, Alkali-Soluble Resin) | Acid-Decomposable Group |
|---|---|---|---|---|
| Example 13 | Compound (Ib-4) 0.10 g | PHS/EES 1.90 g | PHS/OHS 1.40 g — | — |
| Example 14 | Compound (Ib-3) 0.10 g | PHS/THPS 1.90 g | — | — |
| Example 15 | Compound (Ib-5) 0.10 g | PHS/EES 1.90 g | — | — |
| Example 16 | Compound (Ib-11) 0.10 g | PHS/TBOMS 1.60 g | Dissolution Inhibitive Compound (7) 0.30 g | EE |
| Example 17 | Compound (Ib-4) 0.10 g | PHS/THPS 1.60 g | Dissolution Inhibitive Compound (16) 0.30 g | TBE |
| Example 18 | Compound (Ib-15) 0.10 g | PHS/TBOMS 1.60 g | Dissolution Inhibitive Compound (18) 0.30 g | THP |
| Example 19 | Compound (Ib-22) 0.10 g | PHS/TBOMS 1.60 g | Dissolution Inhibitive Compound (41) 0.30 g | EE |
| Example 20 | Compound (Ib-26) 0.10 g | PHS/THPS 1.20 g | Dissolution Inhibitive Compound (18) 0.30 g PHS/AcST 0.40 g | THP |
| Example 21 | Compound (Ib-28) 0.10 g | | Dissolution Inhibitive Compound (62) 0.50 g PHS/St 1.40 g | THP |
| Comparative Example 1 | Comparative Compound (C) 0.10 g | PHS/EES 1.90 g | | |
| Comparative Example 2 | Comparative Compound (C) 0.10 g | PHS/THPS 1.60 g | Dissolution Inhibitive Compound (16) 0.30 g | TBE |
| Comparative Example 3 | Comparative Compound (C) 0.10 g | — | Dissolution Inhibitive Compound (62) 0.50 g PHS/St 1.40 g | TBP |
| Comparative Example 4 | Comparative Compound (D) 0.10 g | PHS/EES 1.90 g | — | — |

The abbreviations used in Table 2 have the following meanings.

Polymers (The ratios given in parentheses are by mole.)

PHS/EES
p-hydroxystyrene/p-(1-ethoxyethoxy)styrene copolymer (70/30) (weight-average molecular weight, 21,000)

PHS/BES
p-hydroxystyrene/p-(1-t-butoxyethoxy)styrenecopolymer (70/30) (weight-average molecular weight, 22,000)

PHS/TBOMS
p-hydroxystyrene/t-butoxycarbonylmethyloxystyrene copolymer (80/20) (weight-average molecular weight, 20,000)

PHS/THPS
p-hydroxystyrene/p-(2-tetrahydropyranyloxy)styrene copolymer (70/30) (weight-average molecular weight, 22,000)

PHS/St
p-hydroxystyrene/styrene copolymer (85/15) (weight-average molecular weight, 35,000)

PHS/AcST
p-hydroxystyrene/p-acetoxystyrene copolymer (80/20) (weight-average molecular weight, 20,000)

PHS/OHS
p-hydroxystyrene/o-hydroxystyrene copolymer (80/20) (weight-average molecular weight, 32,000)

Acid-decomposable Groups in Dissolution Inhibitive Compounds

TBOC:

TBE:
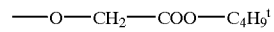

THP:
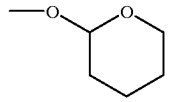

EE:
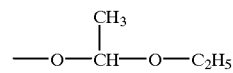

Comparative Compounds (C):

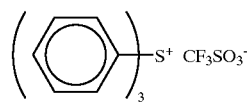

(triphenylsulfonium trifluoromethanesulfonate)

(D):

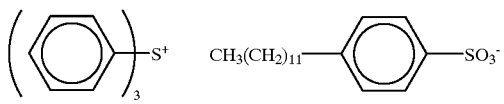

(triphenylsulfonium n-dodecylbenzenesulfonate)

Preparation and Evaluation of Photosensitive Compositions

To each mixture shown in Table 2 was added 0.02 g of 4-dimethylaminopyridine. The resulting mixture was dissolved into 9.5 g of propylene glycol monomethyl ether acetate, and this solution was filtered through a 0.2 μm filter to prepare a resist solution. Each resist solution was applied to a silicon wafer with a spin coater, and the coating was dried at 110° C. for 90 seconds with a vacuum suction type hot plate to obtain a resist film having a thickness of 0.83 μm.

These resist films were exposed to light using a 248 nm KrF excimer laser stepper (NA=0.42). Immediately after the exposure, the resist films each was heated with a 100° C. vacuum suction type hot plate for 60 seconds, subsequently immersed for 60 seconds in a 2.38% aqueous solution of tetramethylammonium hydroxide (TMAH), rinsed with water for 30 seconds, and then dried. The thus-obtained resist patterns on silicon wafers were evaluated for profile, sensitivity, and resolution by the following methods and compared. The results obtained are shown in Table 3.

Profile

The thus-obtained resist patterns on silicon wafers were examined with a scanning electron microscope to evaluate the profile of each pattern.

Sensitivity

Sensitivity is expressed in terms of the exposure energy necessary for reproducing a 0.40 μm mask pattern.

Resolution

Resolution is expressed in terms of threshold resolution at the exposure energy necessary for reproducing a 0.40 μm mask pattern.

Further, after exposure was conducted in the same manner as described above, the resist films were allowed to stand for 2 hours and then heated in the same manner. Immediately thereafter, the resist films were immersed for 60 seconds in a 2.38% aqueous solution of tetramethylammonium hydroxide (TMAH), rinsed with water for 30 seconds, and then dried. The line width of each of the thus-obtained 0.35 μm mask patterns was measured, and the difference between this found value and that of the corresponding mask pattern obtained through heating immediately after exposure was calculated. The results obtained are shown in Table 3.

TABLE 3

Results of Evaluation

| | Sensitivity (mJ/cm$^2$) | Resolution (μm) | Profile of resist pattern | Line width difference between heating immediately after exposure and heating at 2 hr after exposure |
|---|---|---|---|---|
| Example 2 | 20 | 0.28 | rectangular | A |
| Example 3 | 21 | 0.28 | rectangular | A |
| Example 4 | 21 | 0.30 | rectangular | B |
| Example 5 | 23 | 0.28 | rectangular | A |
| Example 6 | 20 | 0.30 | rectangular | B |
| Example 7 | 20 | 0.28 | rectangular | A |
| Example 8 | 22 | 0.30 | rectangular | B |
| Example 9 | 19 | 0.28 | rectangular | A |
| Example 10 | 20 | 0.28 | rectangular | A |
| Example 11 | 23 | 0.28 | rectangular | A |
| Example 12 | 20 | 0.30 | rectangular | A |
| Example 13 | 20 | 0.28 | rectangular | A |
| Example 14 | 21 | 0.30 | rectangular | A |
| Example 15 | 19 | 0.30 | rectangular | B |
| Example 16 | 21 | 0.28 | rectangular | A |
| Example 17 | 20 | 0.28 | rectangular | A |
| Example 18 | 21 | 0.30 | rectangular | B |
| Example 19 | 19 | 0.28 | rectangular | A |
| Example 20 | 22 | 0.28 | rectangular | A |
| Example 21 | 21 | 0.30 | rectangular | B |
| Comparative Example 1 | 24 | 0.30 | rectangular | C |
| Comparative Example 2 | 23 | 0.30 | rectangular | C |
| Comparative Example 3 | 23 | 0.30 | rectangular | C |
| Comparative Example 4 | 26 | 0.30 | rectangular | C |

Symbols in the Table (line width difference: decrease)

A: 0–7%

B: 8–14%

C: ≧15%

The results given in Table 3 show that the resists according to the present invention were positive photosensitive compositions which gave a resist pattern with a satisfactory profile, had high sensitivity and high resolution, and were reduced in line width change with the lapse of time after exposure as compared with the resists of Comparative Examples 1 to 4.

As demonstrated above, the chemically amplified positive photosensitive composition of the present invention gives a resist pattern with a satisfactory profile, has high sensitivity and high resolution, and suffers little performance change with the lapse of time after exposure.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising (1) a resin having group(s) capable of decomposing by the action of an acid to enhance solubility of the resin in an alkaline developing solution and (2) one compound selected from the group consisting of compounds represented by formulas (Ia) and (Ib) which is capable of generating a sulfonic acid upon irradiation with actinic rays or a radiation:

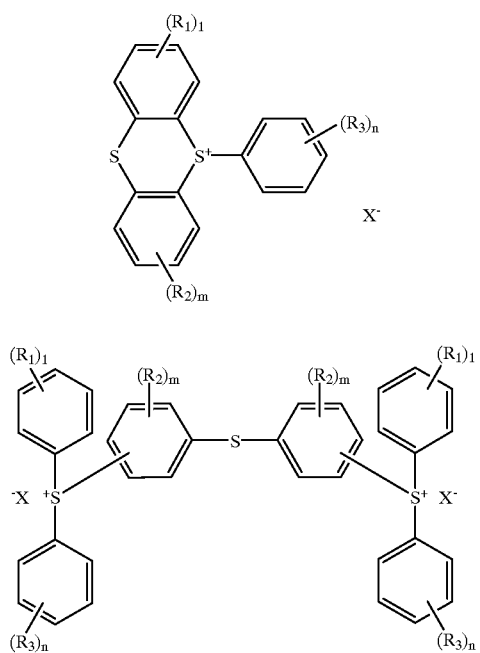

wherein $R_1$ to $R_3$, which may be the same or different, each represents a hydrogen atom, an alkyl group, a cycloalkyl group, an alkoxy group, a hydroxy group, a halogen atom, or a group represented by —S—$R_4$, where $R_4$ represents an alkyl group or an aryl group; $X^-$ represents the anion of a benzenesulfonic, naphthalenesulfonic, or anthracenesulfonic acid which has at least one group selected from the group consisting of linear, branched and cyclic, alkyl and alkoxy groups having 8 or more carbon atoms, or has at least two groups selected from the group consisting of linear, branched and cyclic, alkyl and alkoxy groups having 4 to 7 carbon atoms, or has at least three groups selected from the group consisting of linear and branched aklyl and alkoxy groups having 1 to 3 carbon atoms; and 1, m, and n, which are the same or different, each represents an integer of 1 to 3, and when 1, m, or n is 2 or 3, two of the plural groups of each of $R_1$ to $R_3$ may be combined to form a ring composed of 5 to 8 atoms including a carbon ring, a heterocyclic ring, and an aromatic ring.

2. The positive photosensitive composition of claim 1, wherein $R_1$ to $R_3$ each represents a hydrogen atom, an alkyl group having 1 to 4 carbon atoms which may have substituent(s), a cycloalkyl group having 3 to 8 carbon atoms which may have substituent(s), an alkoxy group having 1 to 4 carbon atoms which may have substituent(s), a hydroxy group, a halogen atom, or a group represented by —S—$R_4$, where $R_4$ represents an alkyl group having 1 to 4 carbon atoms which may have substituent(s) or an aryl group having 6 to 14 carbon atoms which may have substituent(s).

3. The positive photosensitive composition of claim 2, wherein the substituent which $R_1$ to $R_3$ may have is selected from the group consisting of an alkoxy group having 1 to 4 carbon atoms, a halogen atom, an aryl group having 6 to 10 carbon atoms, an alkenyl group having 2 to 6 carbon atoms, a cyano group, a hydroxy group, a carboxy group, an alkoxycarbonyl group, and a nitro group.

4. The positive photosensitive composition of claim 1, which contains a low-molecular-acid-decomposable dissolution inhibitive compound having a molecular weight of 3,000 or lower which has group(s) decomposable by an acid and exhibits enhanced solubility in an alkaline developing solution by the action of an acid.

5. The positive photosensitive composition of claim 4, which contains a resin insoluble in water and soluble in an aqueous alkali solution.

6. The positive photosensitive composition of claim 1, which contains a resin insoluble in water and soluble in an aqueous alkali solution.

7. A positive photosensitive composition comprising
(1) one compound selected from the group consisting of compounds represented by the following general formulas (Ia) and (Ib) which is capable of generating a sulfonic acid upon irradiation and with actinic rays or a radiation,
(2) a low-molecular acid-decomposable dissolution inhibitive compound having a molecular weight of 3,000 or lower which has group(s) decomposable by an acid and exhibits enhanced solubility in an alkaline developing solution by the action of an acid, and
(3) a resin insoluble in water and soluble in an aqueous alkali solution:

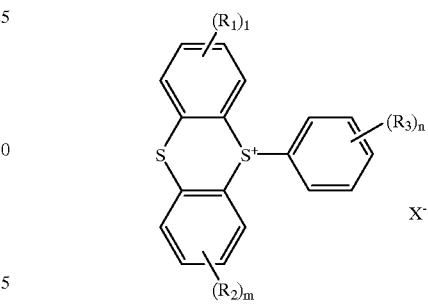

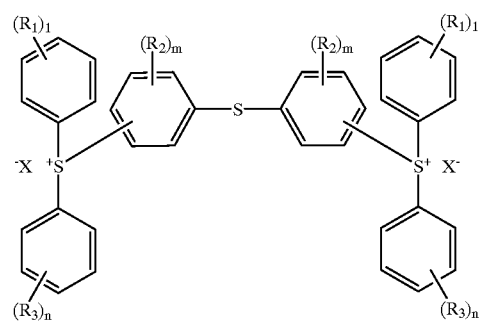

wherein $R_1$ to $R_3$, which may be the same or different, each represents a hydrogen atom, an alkyl group, a cycloalkyl group, an alkoxy group, a hydroxy group, a halogen atom, or a group represented by —S—$R_4$, where $R_4$ represents an alkyl group or an aryl group; $X^-$ represents the anion of a benzenesulfonic, naphthalenesulfonic, or anthracenesulfonic acid which has at least one group selected from the group consisting of linear, branched and cyclic, alkyl and alkoxy groups having 8 or more carbon atoms, or has at least two groups selected from the group consisting of linear, branched and cyclic, alkyl and alkoxy groups having 4 to 7 carbon atoms, or has at least three groups selected from the group consisting of linear and branched alkyl and alkoxy groups having 1 to 3 carbon atoms; and 1, m, and n, which are the same or different, each represents an integer of 1 to 3, and when 1, m, or n is 2 or 3, two of plural groups of each of $R_1$ to $R_3$ may be combined to form a ring composed of 5 to 8 atoms including a carbon ring, a heterocyclic ring, and an aromatic ring.

8. The positive photosensitive composition of claim 7, wherein $R_1$ to $R_3$ each represents a hydrogen atom, an alkyl group having 1 to 4 carbon atoms which may have substituent(s), a cycloalkyl group having 3 to 8 carbon atoms which may have substituent(s), an alkoxy group having 1 to 4 carbon atoms which may have substituent(s), a hydroxy group, a halogen atom, or a group represented by —S—$R_4$, where $R_4$ represents an alkyl group having 1 to 4 carbon atoms which may have substituent(s) or an aryl group having 6 to 14 carbon atoms which may have substituent(s).

9. The positive photosensitive composition of claim 8, wherein the substituent which $R_1$ to $R_3$ may have is selected from the group consisting of an alkoxy group having 1 to 4 carbon atoms, a halogen atom, an aryl group having 6 to 10 carbon atoms, an alkenyl group having 2 to 6 carbon atoms, a cyano group, a hydroxy group, a carboxy group, an alkoxycarbonyl group, and a nitro group.

* * * * *